United States Patent
Abiko

(10) Patent No.: US 12,125,528 B2
(45) Date of Patent: Oct. 22, 2024

(54) SEMICONDUCTOR MEMORY DEVICE

(71) Applicant: KIOXIA CORPORATION, Tokyo (JP)

(72) Inventor: Naofumi Abiko, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 245 days.

(21) Appl. No.: 17/896,929

(22) Filed: Aug. 26, 2022

(65) Prior Publication Data

US 2023/0186984 A1 Jun. 15, 2023

(30) Foreign Application Priority Data

Dec. 10, 2021 (JP) .................. 2021-200707

(51) Int. Cl.
*G11C 11/56* (2006.01)
*G11C 16/10* (2006.01)
*G11C 16/26* (2006.01)
*G11C 16/34* (2006.01)

(52) U.S. Cl.
CPC ...... *G11C 11/5628* (2013.01); *G11C 11/5642* (2013.01); *G11C 11/5671* (2013.01); *G11C 16/10* (2013.01); *G11C 16/26* (2013.01); *G11C 16/3459* (2013.01)

(58) Field of Classification Search
CPC ............ G11C 11/5628; G11C 11/5642; G11C 11/5671; G11C 16/10; G11C 16/26; G11C 16/3459; G11C 2211/5642; G11C 16/30; G11C 16/32; G11C 16/3454; G11C 16/0483; G11C 29/42
USPC .................................................. 365/185.03
See application file for complete search history.

(56) References Cited

U.S. PATENT DOCUMENTS

| | | | |
|---|---|---|---|
| 2006/0239078 A1* | 10/2006 | Lee | G11C 16/12 365/185.17 |
| 2008/0106944 A1 | 5/2008 | Kim | |
| 2012/0198297 A1* | 8/2012 | Kamigaichi | G11C 16/3404 365/185.11 |
| 2017/0236595 A1 | 8/2017 | Maejima et al. | |
| 2020/0234776 A1* | 7/2020 | Yamada | G06F 13/1668 |
| 2021/0065808 A1 | 3/2021 | Wang et al. | |
| 2021/0104286 A1* | 4/2021 | Nagao | G11C 16/10 |
| 2021/0183448 A1 | 6/2021 | Shin et al. | |

FOREIGN PATENT DOCUMENTS

| | | |
|---|---|---|
| JP | 2017142874 A | 8/2017 |
| TW | 200905683 A | 2/2009 |

* cited by examiner

*Primary Examiner* — Huan Hoang
*Assistant Examiner* — Minh Dinh
(74) *Attorney, Agent, or Firm* — Kim & Stewart LLP

(57) ABSTRACT

A semiconductor memory device includes memory cell transistors and a control circuit. In a write operation, the control circuit executes multiple loops each including a program operation, a verify operation, and a bit scan operation. In the bit scan operation, the control circuit performs, a first process of generating verify result data in parallel for a group of memory cell transistors having different target threshold voltage states, the verify result data for each memory cell transistor in the group indicating whether the memory cell transistor has reached its target threshold voltage state, and a second process of calculating for each of the target threshold voltage states, the number of memory cell transistors that have not reached their target threshold voltage states.

20 Claims, 17 Drawing Sheets

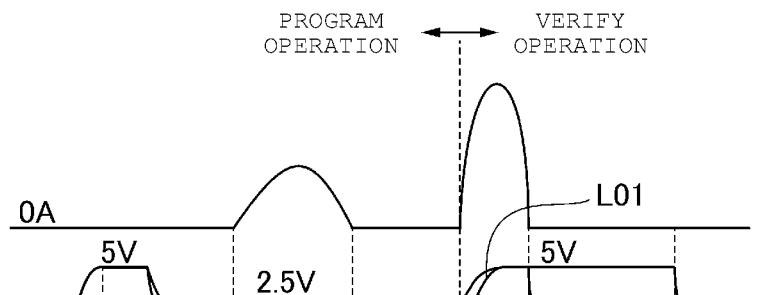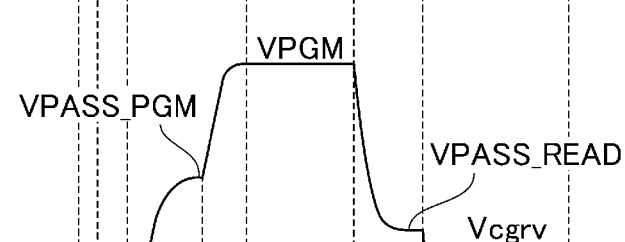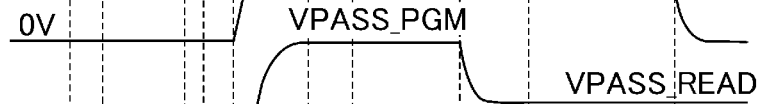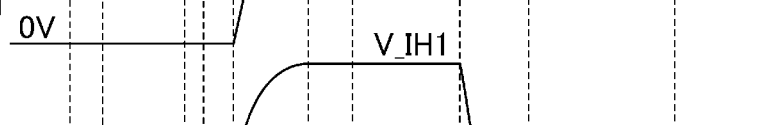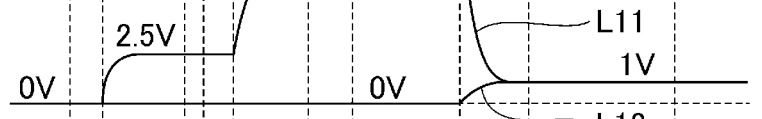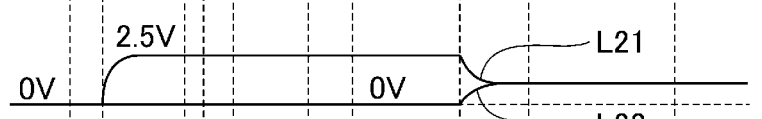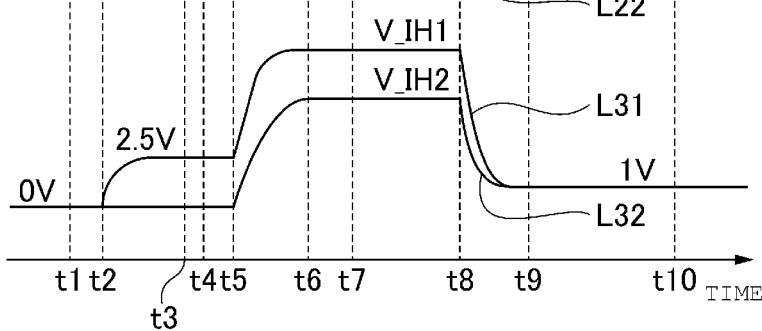

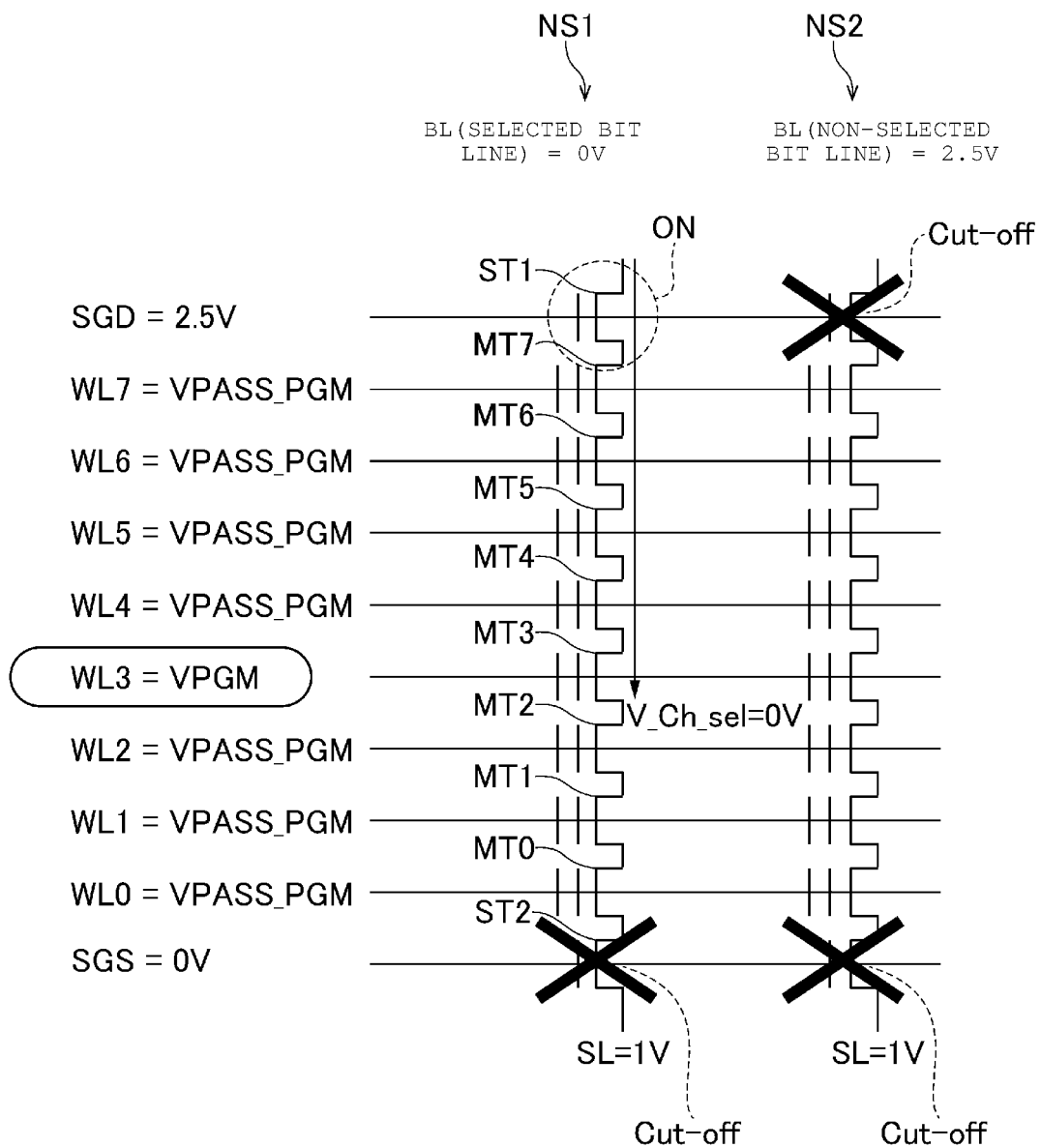

FIG. 13

| VERIFY TARGET STATE \ NUMBER OF LOOPS | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" STATE (VfyA) | ○ | ○ | ○ | ○ | | | | | | | | | | | | | | | |
| "B" STATE (VfyB) | | | ○ | ○ | ○ | ○ | | | | | | | | | | | | | |
| "C" STATE (VfyC) | | | | ○ | ○ | ○ | ○ | ○ | | | | | | | | | | | |
| "E" STATE (VfyE) | | | | | | | ○ | ○ | ○ | ○ | | | | | | | | | |
| "D" STATE (VfyD) | | | | | | | ○ | ○ | ○ | ○ | | | | | | | | | |
| "F" STATE (VfyF) | | | | | | | | | ○ | ○ | ○ | ○ | ○ | ○ | ○ | ○ | | | |
| "G" STATE (VfyG) | | | | | | | | | | | ○ | ○ | ○ | ○ | ○ | ○ | ○ | ○ | ○ |

FIG. 14

| PROGRAM TARGET STATE \ NUMBER OF LOOPS | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" STATE (inhibit) | 1 | 1 | 1 | 1 | 1 | 1 | 1 | 1 | 1 | 1 | 1 | 1 | 1 | 1 | 1 | 1 | 1 | 1 | 1 |
| "A" STATE | 0 | 0/1 | 0/1 | 0/1 | 0/1 | 1 | 1 | 1 | 1 | 1 | 1 | 1 | 1 | 1 | 1 | 1 | 1 | 1 | 1 |
| "B" STATE | 0 | 0 | 0 | 0/1 | 0/1 | 0/1 | 0/1 | 1 | 1 | 1 | 1 | 1 | 1 | 1 | 1 | 1 | 1 | 1 | 1 |
| "C" STATE | 0 | 0 | 0 | 0 | 0 | 0/1 | 0/1 | 0/1 | 0/1 | 1 | 1 | 1 | 1 | 1 | 1 | 1 | 1 | 1 | 1 |
| "D" STATE | 0 | 0 | 0 | 0 | 0 | 0 | 0 | 0/1 | 0/1 | 0/1 | 0/1 | 1 | 1 | 1 | 1 | 1 | 1 | 1 | 1 |
| "E" STATE | 0 | 0 | 0 | 0 | 0 | 0 | 0 | 0 | 0 | 0/1 | 0/1 | 0/1 | 0/1 | 1 | 1 | 1 | 1 | 1 | 1 |
| "F" STATE | 0 | 0 | 0 | 0 | 0 | 0 | 0 | 0 | 0 | 0 | 0 | 0/1 | 0/1 | 0/1 | 0/1 | 1 | 1 | 1 | 1 |
| "G" STATE | 0 | 0 | 0 | 0 | 0 | 0 | 0 | 0 | 0 | 0 | 0 | 0 | 0 | 0 | 0/1 | 0/1 | 0/1 | 0/1 | 0/1 |

FIG. 15

| | SAU101 ⎱BL101 | SAU102 ⎱BL102 | SAU103 ⎱BL103 | SAU104 ⎱BL104 |
|---|---|---|---|---|
| TARGET STATE | ER | A | B | C |
| ADL (UPPER) | 1 | 1 | 1 | 0 |
| BDL (MIDDLE) | 1 | 1 | 0 | 0 |
| CDL (LOWER) | 1 | 0 | 0 | 0 |

FIG. 16

| TARGET STATE | ER | A | B | C |
|---|---|---|---|---|
| ADL (UPPER) | 1 | 1 | 1 | 0→1 |
| BDL (MIDDLE) | 1 | 1 | 0→1 | 0→1 |
| CDL (LOWER) | 1 | 0→1 | 0→1 | 0→1 |
| VERIFY RESULT A | 0 | 1→0 | 0 | 0 | A and B and (not C)
| VERIFY RESULT B | 0 | 0 | 1→0 | 0 | A and (not B) and (not C)
| VERIFY RESULT C | 0 | 0 | 0 | 1→0 | (not A) and (not B) and (not C)

SAU101 — BL101
SAU102 — BL102
SAU103 — BL103
SAU104 — BL104

VERIFY RESULT DATA

SEMICONDUCTOR MEMORY DEVICE

CROSS-REFERENCE TO RELATED APPLICATION

This application is based upon and claims the benefit of priority from Japanese Patent Application No. 2021-200707, filed Dec. 10, 2021, the entire contents of which are incorporated herein by reference.

FIELD

Embodiments described herein relate generally to a semiconductor memory device.

BACKGROUND

A semiconductor memory device such as a NAND flash memory includes a plurality of memory cell transistors for storing data. Writing data to the memory cell transistor involves a program operation for changing a threshold voltage of the memory cell transistor, and a verify operation for determining whether the threshold voltage has reached a target state. Further, a bit scan operation is also performed to acquire, from the result of the verify operation, the number of memory cell transistors having threshold voltages that have not reached the target state.

DESCRIPTION OF THE DRAWINGS

FIG. 10A is diagram illustrating a change in the current supplied to the memory cell array during a write operation.

FIGS. 10B-10G are diagrams illustrating a voltage change of various wirings during the write operation.

FIG. 11 is an equivalent circuit diagram illustrating a state of a NAND string during the write operation.

FIG. 13 is a diagram illustrating a relationship between the number of loops and a verify operation during the write operation.

FIG. 14 is a diagram illustrating a relationship between the number of loops and a program operation during the write operation.

FIG. 15 is a diagram illustrating data stored in a latch circuit of the sense amplifier unit during the write operation.

FIG. 16 is a diagram illustrating a change in data stored in the latch circuit of a sense amplifier unit during the write operation.

DETAILED DESCRIPTION

Figure 1:
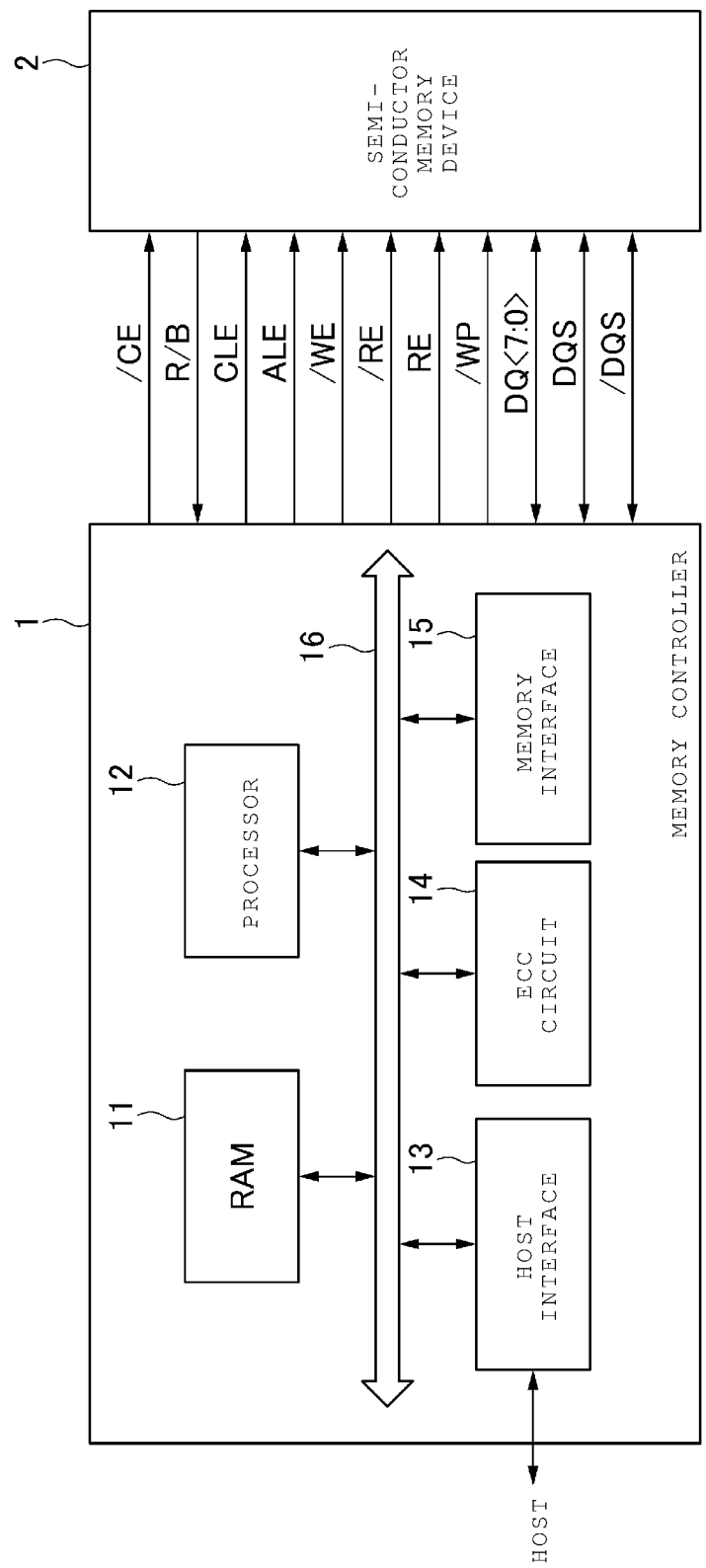
FIG. 1 is a block diagram illustrating a configuration example of a memory system according to an embodiment.

Embodiments provide a semiconductor memory device in which the bit scan operation can be completed in a short time.

In general, according to one embodiment, a semiconductor memory device includes a memory cell array including a plurality of memory cell transistors, and a control circuit that controls an operation of the memory cell array. In a write operation for writing data to the memory cell array, the control circuit executes a loop a plurality of times. Each loop includes a program operation for changing threshold voltages of some of the memory cell transistors, a verify operation for determining whether the memory cell transistors have reached their respective target threshold voltage states, and a bit scan operation for acquiring the number of memory cell transistors determined not to have reached their respective target threshold voltage states. In the bit scan operation, the control circuit performs, a first process of generating verify result data in parallel for a group of memory cell transistors having different target threshold voltage states, the verify result data for each memory cell transistor in the group indicating whether the memory cell transistor has reached its target threshold voltage state, and a second process of calculating for each of the target threshold voltage states, the number of memory cell transistors that have not reached their target threshold voltage states.

Hereinafter, an embodiment will be described with reference to the accompanying drawings. In order to facilitate understanding of the description, the same components are designated by the same reference numerals in the drawings as much as possible, and duplicate descriptions are omitted.

A semiconductor memory device 2 according to one embodiment is a non-volatile memory device configured as a NAND flash memory. FIG. 1 illustrates, in a block diagram, a configuration example of a memory system including the semiconductor memory device 2. The memory system includes a memory controller 1 and the semiconductor memory device 2. In actual configurations, a plurality of semiconductor memory devices 2 may be provided in the memory system of FIG. 1, but only one of them is illustrated in FIG. 1. The specific configuration of the semiconductor memory device 2 will be described below. The memory system is connectible to a host (not illustrated). For example, the host is an electronic device such as a personal computer, a mobile terminal, or the like.

The memory controller 1 controls the writing of data to the semiconductor memory device 2 according to a write request from the host. Further, the memory controller 1 controls the reading of data from the semiconductor memory device 2 according to a read request from the host.

Between the memory controller 1 and the semiconductor memory device 2, various control and data signals, including a chip enable signal /CE, a ready busy signal R/B, a command latch enable signal CLE, an address latch enable signal ALE, a write enable signal /WE, a read enable signal /RE, RE, a write protect signal /WP, a data signal DQ<7:0>, and a data strobe signal DQS, /DQS, are transmitted and received.

The chip enable signal /CE is a signal for enabling the semiconductor memory device 2. The ready busy signal R/B is a signal for indicating whether the semiconductor memory device 2 is in the ready state or the busy state. The "ready state" is a state in which an external command can be received. The "busy state" is a state in which an external command cannot be received. The command latch enable signal CLE is a signal for indicating that the signal DQ<7:0> contains a command. The address latch enable signal ALE is a signal for indicating that the signal DQ<7:0> contains an address. The write enable signal /WE is asserted each time a command, an address, and data are transmitted to the memory controller 1 and is a signal instructing the semiconductor memory device 2 to receive the signal DQ<7:0> containing the command, the address, or the data, while the signal /WE is at an "L (Low)" state.

The read enable signal /RE is a signal used by the memory controller 1 to read data from the semiconductor memory device 2. The signal RE is a complementary signal of signal /RE. For example, these signals are used to control the operation timing of the semiconductor memory device 2 for outputting the signal DQ<7:0>. The write protect signal /WP is a signal for instructing the semiconductor memory device 2 to prohibit data writing and erasing. The signal DQ<7:0> is transmitted and received between the semiconductor memory device 2 and the memory controller 1, and contains commands, addresses, or data. The data strobe signal DQS is a signal for controlling the input and output timing of the signal DQ<7:0>. The signal /DQS is a complementary signal of the signal DQS.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other via an internal bus 16.

The host interface 13 outputs a request received from the host, user data (e.g., write data), and the like to the internal bus 16. Further, the host interface 13 transmits user data read from the semiconductor memory device 2, a response from the processor 12, and the like to the host.

The memory interface 15 controls a process of writing user data or the like to the semiconductor memory device 2 and a process of reading the user data or the like from the semiconductor memory device 2 based on the instruction of the processor 12.

The processor 12 controls the memory controller 1. For example, the processor 12 is a CPU, an MPU, or the like. When the processor 12 receives a request from the host via the host interface 13, the processor 12 controls the memory controller 1 according to the request. For example, the processor 12 instructs the memory interface 15 to write user data and parity to the semiconductor memory device 2 in response to a request from the host. Further, the processor 12 instructs the memory interface 15 to read the user data and the parity from the semiconductor memory device 2 according to the request from the host.

The processor 12 determines a storage area (memory area) in the semiconductor memory device 2 for the user data stored in the RAM 11. The user data is stored in the RAM 11 via the internal bus 16. The processor 12 determines the memory area for the page-based data (page data), which is the unit of writing into the semiconductor memory device 2. The user data stored in one page of the semiconductor memory device 2 is also referred to as "unit data" below. The unit data is generally encoded and stored in the semiconductor memory device 2 as a codeword. In the present embodiment, coding is optional. The memory controller 1 may store the unit data in the semiconductor memory device 2 without encoding, but FIG. 1 illustrates a configuration in which encoding is performed as an example of the configuration. When the memory controller 1 does not encode, the page data matches the unit data. Further, one codeword may be generated based on one unit data, or one codeword may be generated based on the divided data of the unit data. Further, one codeword may be generated using a plurality of unit data.

The processor 12 determines the memory area of the semiconductor memory device 2 to be written for each unit data. A physical address is assigned to the memory area of the semiconductor memory device 2. The processor 12 manages the memory area to which the unit data is written by using the physical address. The processor 12 specifies a determined memory area (through the physical address) and instructs the memory interface 15 to write user data to the semiconductor memory device 2. The processor 12 manages the correspondence relation between a logical address (managed by the host) of the user data and the physical address. When the processor 12 receives a read request including a logical address from the host, the processor 12 specifies the physical address corresponding to the logical address, specifies the physical address, and instructs the memory interface 15 to read the user data.

The ECC circuit 14 encodes the user data stored in the RAM 11 to generate a codeword. Further, the ECC circuit 14 decodes the codeword read from the semiconductor memory device 2. The ECC circuit 14 detects an error in the data and corrects the error by using, for example, a checksum or the like assigned to the user data.

The RAM 11 temporarily stores the user data received from the host until it is stored in the semiconductor memory device 2, or temporarily stores the data read from the semiconductor memory device 2 until it is transmitted to the host. For example, the RAM 11 is a general-purpose memory such as an SRAM, a DRAM, or the like.

FIG. 1 illustrates a configuration example in which the memory controller 1 includes the ECC circuit 14 and the memory interface 15, respectively. However, the ECC circuit 14 may be built in the memory interface 15. Further, the ECC circuit 14 may be built in the semiconductor memory device 2. The specific configuration and arrangement of each element illustrated in FIG. 1 is not considered to be limiting.

When a write request is received from the host, the memory system of FIG. 1 is operated as follows. The processor 12 temporarily stores the data, which is the target of the write operation, in the RAM 11. The processor 12 reads the data stored in the RAM 11 and inputs the data to the ECC circuit 14. The ECC circuit 14 encodes the input data and inputs the codeword to the memory interface 15. The memory interface 15 issues an instruction to write the input codeword in the semiconductor memory device 2.

When a read request is received from the host, the memory system of FIG. 1 is operated as follows. The memory interface 15 inputs the codeword read from the semiconductor memory device 2 to the ECC circuit 14. The ECC circuit 14 decodes the input codeword and stores the decoded data in the RAM 11. The processor 12 transmits the data stored in the RAM 11 to the host via the host interface 13.

Figure 2:
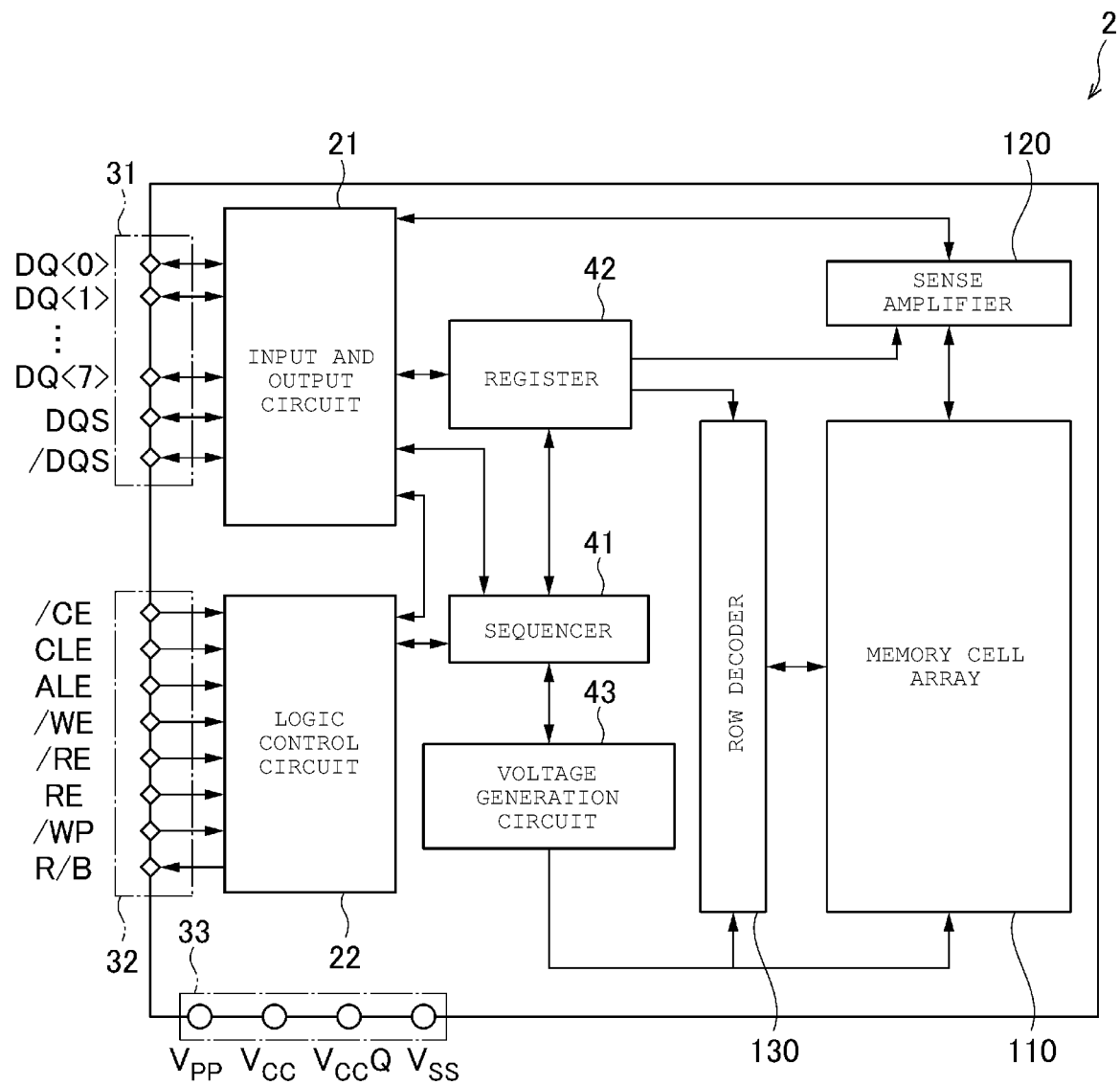
FIG. 2 is a block diagram illustrating a configuration of a semiconductor memory device according to an embodiment.

The configuration of the semiconductor memory device 2 will be described. As illustrated in FIG. 2, the semiconductor memory device 2 includes a memory cell array 110, a sense amplifier 120, a row decoder 130, an input and output circuit 21, a logic control circuit 22, a sequencer 41, a register 42, a voltage generation circuit 43, an input and output pad group 31, a logic control pad group 32, and a power input terminal group 33.

Figure 3:
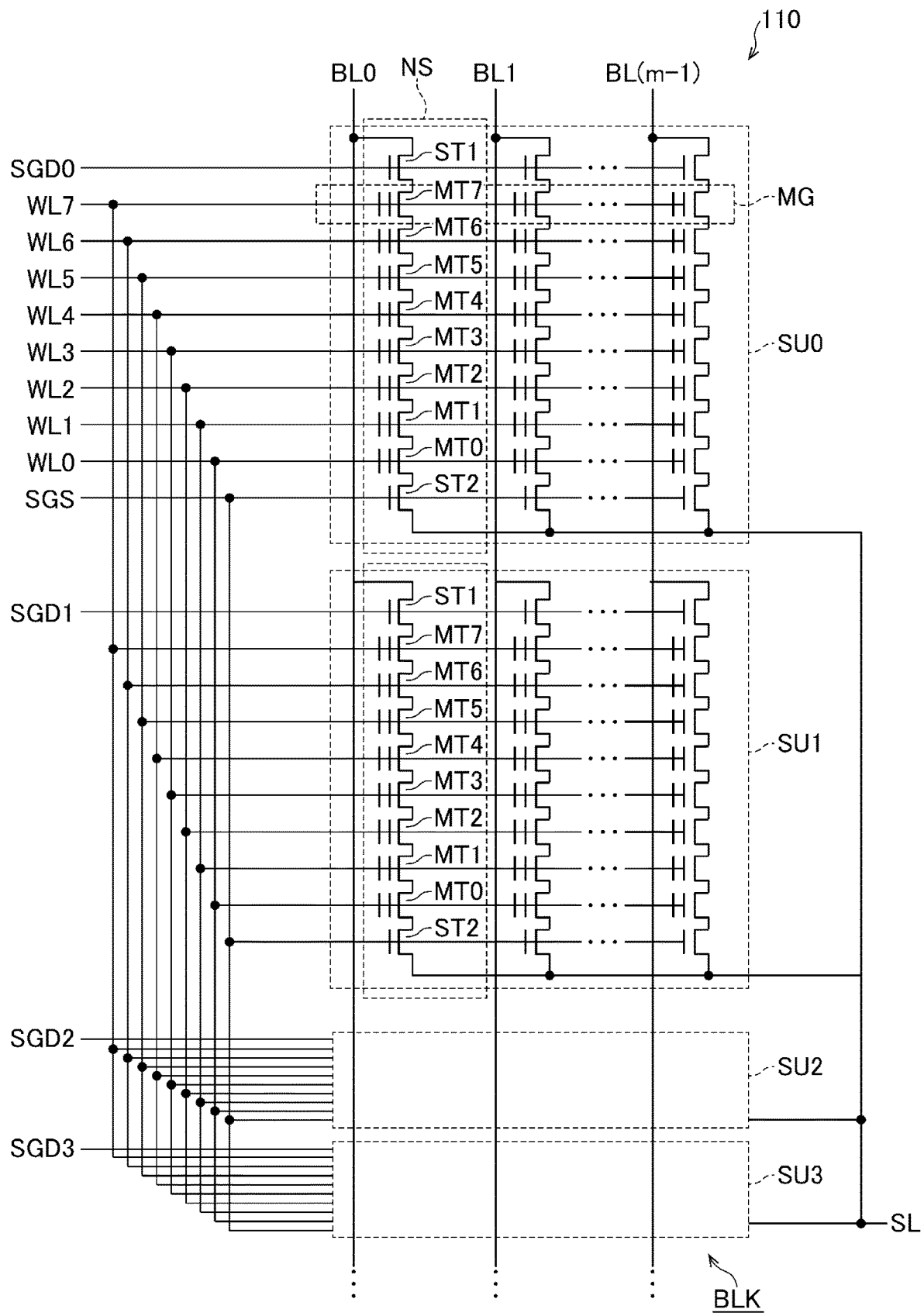
FIG. 3 is an equivalent circuit diagram illustrating a configuration of a memory cell array.

The memory cell array 110 is a part where the data is stored. FIG. 3 illustrates, in an equivalent circuit diagram, a configuration of the memory cell array 110. While the memory cell array 110 may be formed of a plurality of blocks BLK, only one of these blocks BLK is illustrated in FIG. 3. The configuration of the other block BLK in the memory cell array 110 is also the same as that illustrated in FIG. 3.

As illustrated in FIG. 3, the block BLK includes four string units SU (SU0 to SU3), for example. Further, each string unit SU includes a plurality of NAND strings NS. Each of the NAND strings NS includes eight memory cell transistors MT (MT0 to MT7) and select transistors ST1 and ST2, for example.

The number of memory cell transistors MT is not limited to eight, and may be 32, 48, 64, or 96, for example. For example, in order to improve the cutoff characteristic, each of the select transistors ST1 and ST2 may be formed of a plurality of transistors instead of a single transistor. Further, dummy cell transistors may be provided between the memory cell transistor MT and the select transistors ST1 and ST2.

The memory cell transistors MT are located between the select transistor ST1 and the select transistor ST2 so as to be connected in series therewith. The memory cell transistor MT7 on one end side is connected to the source of the select transistor ST1, and the memory cell transistor MT0 on the other end side is connected to the drain of the select transistor ST2.

The gates of the select transistors ST1 of the string units SU0 to SU3 are commonly connected to the select gate lines SGD0 to SGD3, respectively. The gate of the select transistor ST2 is commonly connected to the same select gate line SGS across a plurality of string units SU in the same block BLK. The control gates of the memory cell transistors MT0 to MT7 in the same block BLK are commonly connected to the word lines WL0 to WL7, respectively. That is, while the word lines WL0 to WL7 and the select gate line SGS are common between a plurality of string units SU0 to SU3 in the same block BLK, the select gate lines SGD are individually provided for each of the string units SU0 to SU3 even in the same block BLK.

The memory cell array 110 is provided with m bit lines BL (BL0, BL1, . . . , BL(m−1)), where "m" is an integer representing the number of NAND strings NS in one string unit SU. The drains of the select transistors ST1 of each NAND string NS are connected to the corresponding bit line BL. The sources of the select transistors ST2 are connected to the source line SL. The source line SL is commonly connected to the sources of a plurality of select transistors ST2 in the block BLK.

The data stored in a plurality of memory cell transistors MT in the same block BLK are collectively erased. Meanwhile, reading and writing of data are collectively performed for the plurality of memory cell transistors MT connected to one word line WL and belonging to one string unit SU. In the embodiment illustrated herein, each memory cell can store 3 bits of data formed of an upper bit, a middle bit, and a lower bit.

That is, the semiconductor memory device 2 according to the present embodiment employs a TLC method for storing 3-bit data in one memory cell transistor MT as a method for writing data to the memory cell transistor MT. Instead of such an aspect, for a method of writing data to the memory cell transistor MT, an MLC method for storing 2-bit data in one memory cell transistor MT, an SLC method for storing 1-bit data in one memory cell transistor MT, or the like may be employed.

In addition, in the following description, a set of 1-bit data stored in the plurality of memory cell transistors MT connected to one word line WL and belonging to one string unit SU is referred to as a "page". In FIG. 3, a reference symbol "MG" denotes one of the sets including the plurality of memory cell transistors MT as described above.

When 3-bit data is stored in one memory cell transistor MT as in the present embodiment, a set of the plurality of memory cell transistors MT connected to a common word line WL in one string unit SU can store data for 3 pages.

Figure 4:
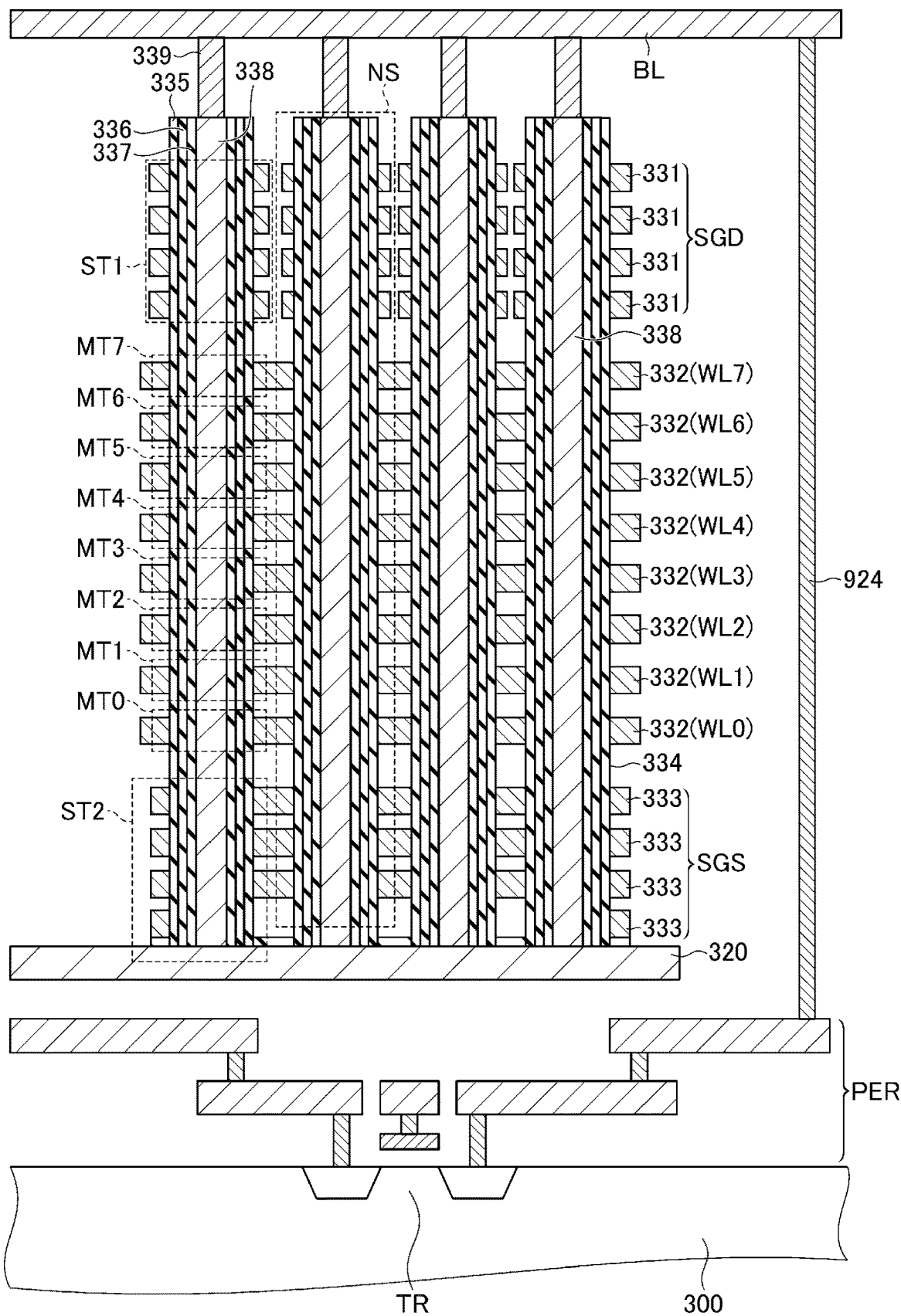
FIG. 4 is a cross-sectional view illustrating a configuration of a memory cell array.

FIG. 4 illustrates, in a schematic cross-sectional view, a configuration of the memory cell array 110. As illustrated in this drawing, in the memory cell array 110, a plurality of NAND strings NS are formed on a conductive layer 320. The conductive layer 320 is also referred to as a built-in source line (BSL), and corresponds to the source line SL in FIG. 3.

There are stacked, above the conductive layer 320, a plurality of wiring layers 333 serving as select gate line SGS, a plurality of wiring layers 332 serving as word line WL, and a plurality of wiring layers 331 serving as select gate line SGD. Insulating layers (not illustrated) are located between the stacked wiring layers 333, 332, and 331, respectively.

A plurality of memory holes 334 are formed in the memory cell array 110. The memory holes 334 penetrate through the wiring layers 333, 332, and 331, and the insulating layers (not illustrated) between them in the vertical direction and reaches the conductive layer 320. A block insulating film 335, a charge storage layer 336, and a gate insulating film 337 are sequentially formed on the side surface of each memory hole 334, and further, a conductive column 338 is buried therein. The conductive column 338 is made of polysilicon, for example, and serves as an area where channels are formed during the operation of the memory cell transistors MT and the select transistors ST1 and ST2 in the NAND string NS. As described above, columnar bodies formed of the block insulating film 335, the charge storage layer 336, the gate insulating film 337, and the conductive column 338 are formed in the memory holes 334.

Each of portions of the columnar bodies formed in the memory holes 334 that intersect each of the stacked wiring layers 333, 332, and 331 serves as a transistor. Any of these plurality of transistors that is in the portion intersecting with the wiring layer 331 serves as the select transistor ST1. Any of the plurality of transistors that is in the portion intersecting with the wiring layer 332 serves as a memory cell transistor MT (MT0 to MT7). Any of the plurality of transistors that is in the portion intersecting with the wiring layer 333 serves as the select transistor ST2. With such a configuration, each of the columnar bodies formed in each memory hole 334 serves as the NAND string NS described with reference to FIG. 3. The conductive column 338 in the columnar body is a part that serves as a channel of the memory cell transistor MT and the select transistors ST1 and ST2.

A wiring layer that serves as a bit line BL is formed above the conductive column 338. A contact plug 339 for connecting the conductive column 338 and the bit line BL is formed at an upper end of the conductive column 338.

A plurality of configurations similar to the configuration illustrated in FIG. 4 are located along the depth direction of the paper surface of FIG. 4. One string unit SU is formed by a set of a plurality of NAND strings NS located in a row along the depth direction of the paper surface of FIG. 4.

In the semiconductor memory device 2 according to the present embodiment, a peripheral circuit PER is provided below the memory cell array 110, that is, at a position between the memory cell array 110 and a semiconductor substrate 300. The peripheral circuit PER is a circuit for carrying out a write operation, a read operation, an erasing operation, and the like of the data in the memory cell array 110. The sense amplifier 120, the row decoder 130, the voltage generation circuit 43, and the like illustrated in FIG. 2 are parts of the peripheral circuit PER. The peripheral circuit PER includes various transistors, RC circuits, and the like. In the example illustrated in FIG. 4, the transistor TR formed on the semiconductor substrate 300 and the bit line BL above the memory cell array 110 are electrically connected to each other via a contact 924.

Instead of such a configuration, the memory cell array 110 may be provided directly on the semiconductor substrate 300. In this case, a p-type well area of the semiconductor substrate 300 serves as the source line SL. In addition, the peripheral circuit PER is provided at a position adjacent to the memory cell array 110 along the surface of the semiconductor substrate 300.

The description will be continued with reference to FIG. 2 again. The sense amplifier 120 is a circuit for adjusting the voltage applied to the bit line BL and reading the voltage of the bit line BL and converting it into data. When reading the data, the sense amplifier 120 transfers the data read from the memory cell transistor MT to the bit line BL, and also transfers the read data to the input and output circuit 21. When writing data, the sense amplifier 120 transfers the write data via the bit line BL to the memory cell transistor MT. The operation of the sense amplifier 120 is controlled by the sequencer 41 described below.

Figure 5:
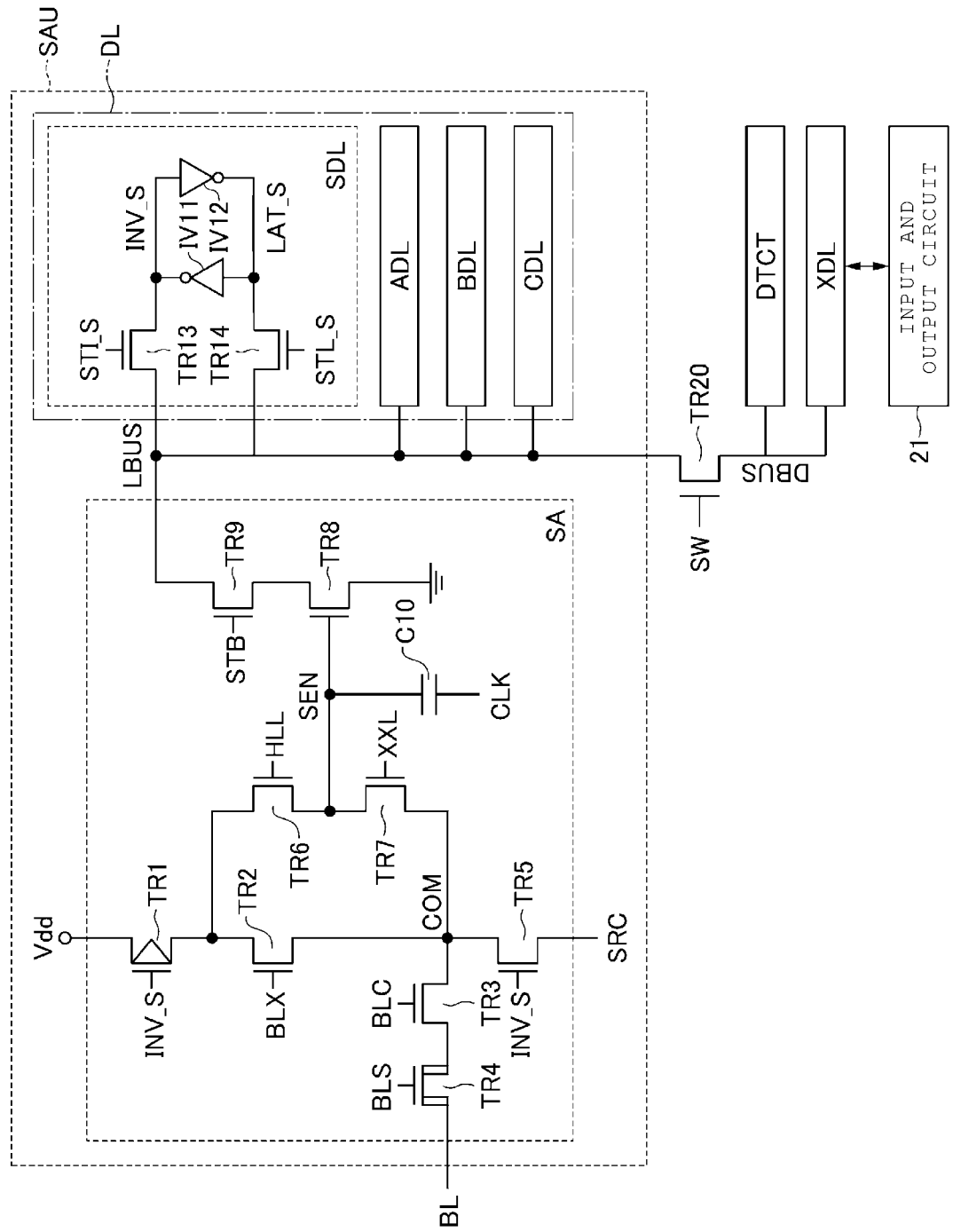
FIG. 5 is a diagram illustrating a circuit configuration of a sense amplifier unit.

The sense amplifier 120 includes a plurality of sense amplifier units SAU corresponding to each of the plurality of bit lines BL. One sense amplifier unit SAU is connected to one bit line BL. That is, the sense amplifier unit SAU is a circuit connected to the memory cell transistor MT of the string unit SU via the bit line BL. FIG. 5 illustrates a detailed circuit configuration of one sense amplifier unit SAU for illustrative purpose.

As illustrated in FIG. 5, the sense amplifier unit SAU includes a sense amplifier part SA and latch circuits SDL, ADL, BDL, CDL, and XDL. The sense amplifier part SA and the latch circuits SDL, ADL, BDL, CDL, and XDL are connected by buses (LBUS, DBUS), so that data can be transmitted and received to and from each other. More specifically, the latch circuits SDL, ADL, BDL, and CDL are commonly connected via the bus LBUS, and the latch circuit XDL is connected to the bus DBUS. The bus LBUS and the bus DBUS are connected to each other via a transistor TR20. A signal SW is input to the gate of the transistor TR20.

Figure 6:
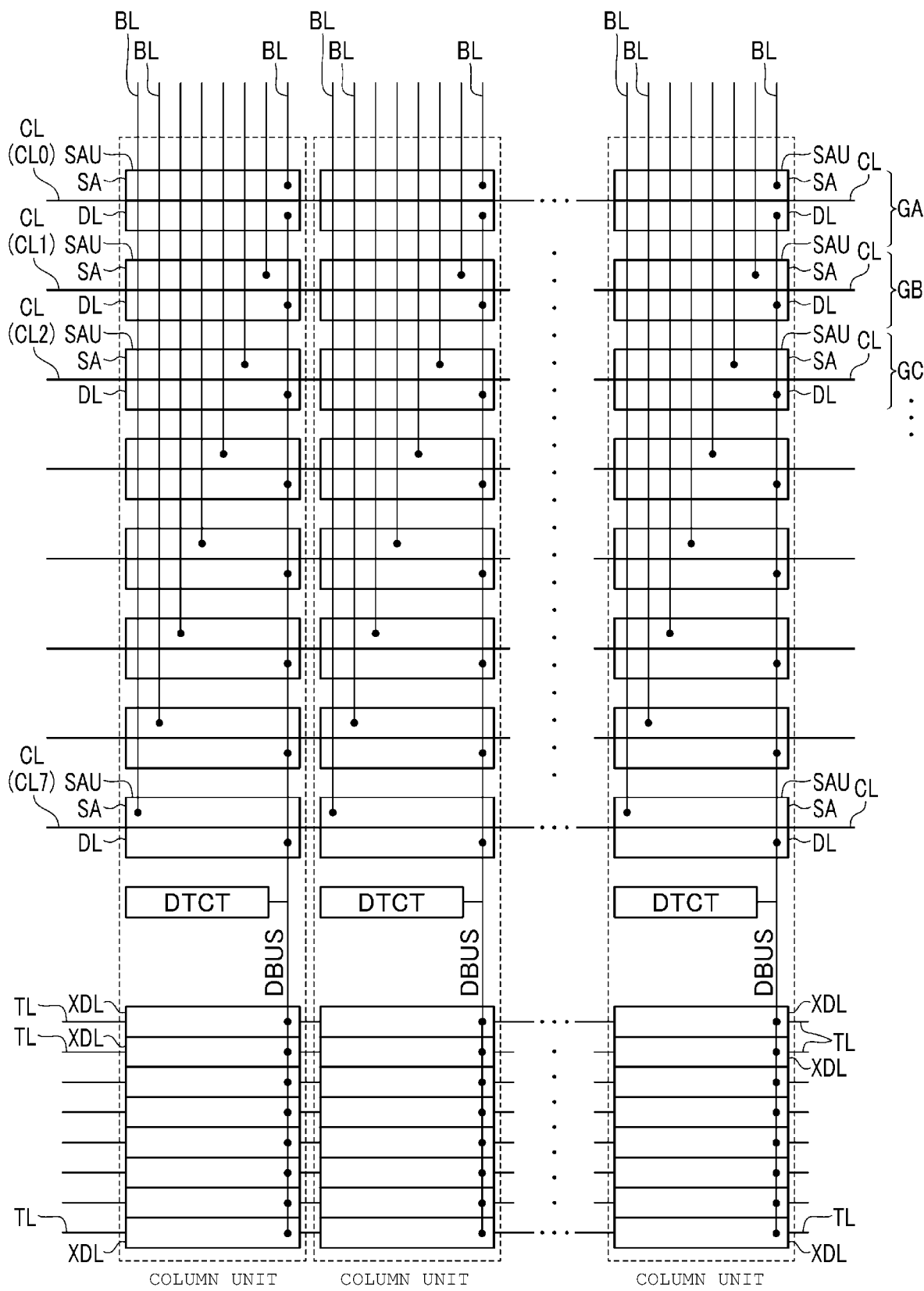
FIG. 6 is a diagram illustrating an arrangement of a plurality of sense amplifier units.

It should be noted that although the latch circuit XDL is a part of the sense amplifier unit SAU as described above, it is not separately provided for each sense amplifier unit SAU, but a plurality of latch circuits XDL is collectively provided for each fixed number of sense amplifier units SAU (see FIG. 6). Therefore, in FIG. 5, the latch circuit XDL is drawn outside a dotted line of the sense amplifier unit SAU.

For example, in the read operation, the sense amplifier part SA senses the data read to the corresponding bit line BL, and determines whether the read data is "0" or "1". The sense amplifier part SA includes a transistor TR1 which is p-channel MOS transistor, transistors TR2 to TR9 which are n-channel MOS transistor, and a capacitor C10, for example.

One end of the transistor TR1 is connected to the power supply line, and the other end of the transistor TR1 is connected to the transistor TR2. The gate of the transistor TR1 is connected to the node INV_S in the latch circuit SDL. One end of the transistor TR2 is connected to the transistor TR1, and the other end of the transistor TR2 is connected to the node COM. A signal BLX is input to the gate of the transistor TR2. One end of the transistor TR3 is connected to the node COM, and the other end of the transistor TR3 is connected to the transistor TR4. The signal BLC is input to the gate of the transistor TR3. The transistor TR4 is a high breakdown voltage MOS transistor. One end of the transistor TR4 is connected to the transistor TR3. The other end of the transistor TR4 is connected to the corresponding bit line BL. The signal BLS is input to the gate of the transistor TR4.

One end of the transistor TR5 is connected to the node COM, and the other end of the transistor TR5 is connected to the node SRC. The gate of the transistor TR5 is connected to the node INV_S. One end of the transistor TR6 is connected to the node between the transistor TR1 and the transistor TR2, and the other end of the transistor TR6 is connected to the node SEN. A signal HLL is input to the gate of the transistor TR6. One end of the transistor TR7 is connected to the node SEN, and the other end of the transistor TR7 is connected to the node COM. A signal XXL is input to the gate of the transistor TR7.

One end of the transistor TR8 is grounded, and the other end of the transistor TR8 is connected to the transistor TR9. The gate of the transistor TR8 is connected to the node SEN. One end of the transistor TR9 is connected to the transistor TR8, and the other end of the transistor TR9 is connected to the bus LBUS. A signal STB is input to the gate of the transistor TR9. One end of the capacitor C10 is connected to the node SEN. A clock CLK is input to the other end of the capacitor C10.

The signals SW, BLX, BLC, BLS, HLL, XXL, and STB are generated by the sequencer 41, for example. Further, for example, a voltage Vdd which is the internal power supply voltage of the semiconductor memory device 2 is applied to the power supply line connected to one end of the transistor TR1, and a voltage Vss which is the ground voltage of the semiconductor memory device 2 is applied to the node SRC, for example.

The latch circuits SDL, ADL, BDL, CDL, and XDL temporarily store the read data and the write data. The latch circuit XDL is connected to the input and output circuit 21 and is used for data input and output between the sense amplifier unit SAU and the input and output circuit 21. The latch circuits SDL, ADL, BDL, and CDL will be collectively referred to as "latch circuit part DL" below.

The latch circuit SDL includes inverters IV11 and IV12 and transistors TR13 and TR14 which are n-channel MOS transistors, for example. An input node of the inverter IV11 is connected to a node LAT_S. An output node of the inverter IV11 is connected to a node INV_S. An input node of the inverter IV12 is connected to the node INV_S. An output node of the inverter IV12 is connected to the node LAT_S. One end of transistor TR13 is connected to the node INV_S, and the other end of the transistor TR13 is connected to the bus LBUS. A signal STI_S is input to the gate of the transistor TR13. One end of the transistor TR14 is connected to the node LAT_S, and the other end of a transistor TR14 is connected to the bus LBUS. A signal STL_S is input to the gate of the transistor TR14. For example, the data stored in the node LAT_S corresponds to the data stored in the latch circuit SDL. Further, the data stored in the node INV_S corresponds to the inverted data of the data stored in the node LAT_S. Since the circuit configuration of the latch circuits ADL, BDL, CDL, and XDL is identical to the circuit configuration of the latch circuit SDL, these will not be described.

As described above, a plurality of sense amplifier units SAU are provided correspondingly to the number of bit lines BL. In other words, a plurality of sense amplifier units SAU are provided at least according to the number of memory cell transistors MT which is the target of the write operation. FIG. 6 illustrates, in a top view, a specific arrangement of the plurality of sense amplifier units SAU. In this drawing, each sense amplifier unit SAU is schematically illustrated separately as "SA" indicating a sense amplifier part SA and "DL" indicating a latch circuit part DL.

In the present embodiment, a plurality of bit lines BL are located as one column unit for every consecutive eight lines, and a total of eight sense amplifier units SAU connected to the bit line BL of the same column unit line up along the extending direction of the bit line BL (vertical direction in FIG. 6). With such an arrangement, it is possible to connect the sense amplifier unit SAU to each bit line BL while sufficiently narrowing the gap between the bit lines BL adjacent to each other.

The sense amplifier units SAU belonging to the column units, which are different from each other, line up along a direction (left-right direction in FIG. 6) perpendicular to the extending direction of the bit line BL. Common control lines CL (CL0, CL1, CL2, . . . ) are connected to a plurality of sense amplifier units SAU located along the corresponding direction. The control lines CL are lines for transmitting a control signal (signal BLX, signal BLS, signal STI_S, and the like described above) from the sequencer 41. While a plurality of control lines CL are connected to one sense amplifier unit SAU, FIG. 6 simply illustrates the plurality of control lines CL as one single line.

With such a configuration, the plurality of sense amplifier units SAU located along the left-right direction in FIG. 6 perform the same operation based on the signals from the common control lines CL. In the present specification, in FIG. 6, the plurality of sense amplifier units SAU located along the left-right direction at the same height position are referred to as "groups". In FIG. 6, each group located along the vertical direction receives separate signals from the respective control lines CL. For example, the groups GA, GB, and GC illustrated in FIG. 6 receive signals from the control lines CL0, CL1, and CL2, respectively. As a result, the sense amplifier units SAU belonging to different groups can perform operations different from each other.

In FIG. 6, a plurality of sense amplifier units SAU located along the vertical direction, that is, eight sense amplifier units SAU belonging to the same column unit are connected to each other via one bus DBUS. Further, the eight latch circuits XDL of the eight sense amplifier units SAU line up along the extending direction of the bit line BL (vertical direction in FIG. 6), and are connected to each other via the same bus DBUS.

The latch circuits XDL of the sense amplifier units SAU belonging to the column units, which are different from each other, line up along a direction (left-right direction in FIG. 6) perpendicular to the extending direction of the bit line BL. Common transfer lines TL are connected to a plurality of latch circuits XDL located along the corresponding direction. The transfer lines TL are control lines for transferring data between the latch circuits XDL and the input and output circuit 21.

Bit detection circuits DTCT are provided in the middle of each bus DBUS connecting the latch circuit parts DL and the latch circuits XDL. The bit detection circuits DTCT are circuits used to count specific information from the verify result data when the bit scan operation is performed. The "bit scan operation" and "verify result data" will be described below.

The description will be continued with reference to FIG. 2 again. The row decoder 130 is a circuit configured as a group of switches (not illustrated) for applying a voltage to each of the word lines WL. The row decoder 130 receives a block address and a row address from the register 42, selects a corresponding block BLK based on the corresponding block address, and also selects a corresponding word line WL based on the corresponding row address. The row decoder 130 switches opening and closing of the switch group described above such that the voltage from the voltage generation circuit 43 is applied to the selected word line WL. The operation of the row decoder 130 is controlled by the sequencer 41.

The input and output circuit 21 transmits and receives the signal DQ<7:0> and the data strobe signals DQS and /DQS to and from the memory controller 1. The input and output circuit 21 transfers the command and address in the signal DQ<7:0> to the register 42. Further, the input and output circuit 21 transmits and receives write data and read data to and from the sense amplifier 120.

The logic control circuit 22 receives a chip enable signal /CE, a command latch enable signal CLE, an address latch enable signal ALE, a write enable signal /WE, a read enable signal RE, /RE, and a write protect signal /WP from the memory controller 1. Further, the logic control circuit 22 transfers the ready busy signal R/B to the memory controller 1 to notify the state of the semiconductor memory device 2 to the outside.

The sequencer 41 controls the operation of each part including the memory cell array 110, based on the control signal input from the memory controller 1 to an interface circuit 20. The sequencer 41 corresponds to the "control circuit" in the present embodiment. Both the sequencer 41 and the logic control circuit 22 can be regarded as the "control circuit" in the present embodiment.

The register 42 is a part that temporarily stores a command or address. The register 42 stores a command that instructs a write operation, a read operation, an erasing operation, and the like. The corresponding command is input from the memory controller 1 to the input and output circuit 21, and then transferred from the input and output circuit 21 to the register 42 and stored.

Further, the register 42 also stores the address corresponding to the command described above. The corresponding address is input from the memory controller 1 to the input and output circuit 21, and then transferred from the input and output circuit 21 to the register 42 and stored.

Further, the register 42 also stores status information indicating the operating state of the semiconductor memory device 2. The status information is updated by the sequencer 41 each time according to the operating state of the memory cell array 110 or the like. The status information is output from the input and output circuit 21 to the memory controller 1 as a status signal in response to a request from the memory controller 1.

The voltage generation circuit 43 is a part that generates a voltage required for each of write operation, read operation, and erasing operation of data in the memory cell array 110. Such a voltage includes a voltage applied to each word line WL, a voltage applied to each bit line BL, and the like, for example. The operation of the voltage generation circuit 43 is controlled by the sequencer 41.

The input and output pad group 31 is a part that is provided with a plurality of terminals (pads) for transmitting and receiving each signal between the memory controller 1 and the input and output circuit 21. The respective terminals are individually provided correspondingly to each of the signal DQ<7:0> and the data strobe signals DQS and /DQS.

The logic control pad group 32 is a part that is provided with a plurality of terminals (pads) for transmitting and receiving each signal between the memory controller 1 and the logic control circuit 22. The respective terminals are individually provided correspondingly to each of a chip enable signal /CE, a command latch enable signal CLE, an address latch enable signal ALE, a write enable signal /WE, a read enable signal RE, /RE, a write protect signal /WP, and a ready busy signal R/B.

The power input terminal group 33 is a part that is provided with a plurality of terminals for receiving the application of each voltage necessary for the operation of the semiconductor memory device 2. The voltage applied to the respective terminals includes the power supply voltages Vcc, VccQ, Vpp, and the ground voltage Vss.

The power supply voltage Vcc is a circuit power supply voltage supplied from the outside as an operating power supply, and is a voltage of about 3.3 V, for example. The power supply voltage VccQ is a voltage of 1.2 V, for example. The power supply voltage VccQ is a voltage used when transmitting and receiving signals between the memory controller 1 and the semiconductor memory device 2. The power supply voltage Vpp is a power supply voltage higher than the power supply voltage Vcc, and is a voltage of 12 V, for example.

When writing data to the memory cell array 110 or erasing the data, a high voltage (VPGM) of about 20 V is required. It is possible to generate a desired voltage at high speed and with low power consumption by boosting the power supply voltage Vpp of about 12 V, rather than boosting the power supply voltage Vcc of about 3.3 V by the booster circuit of the voltage generation circuit 43. However, when the semiconductor memory device 2 is used in an environment where a high voltage cannot be supplied, the voltage may not be supplied to the power supply voltage Vpp. Even when the power supply voltage Vpp is not supplied, the semiconductor memory device 2 can execute various operations as long as the power supply voltage Vcc is supplied. That is, the power supply voltage Vcc is a power supply normally supplied to the semiconductor memory device 2, and the power supply voltage Vpp is a power supply that is additionally and optionally supplied according to the usage environment, for example.

Figure 7:
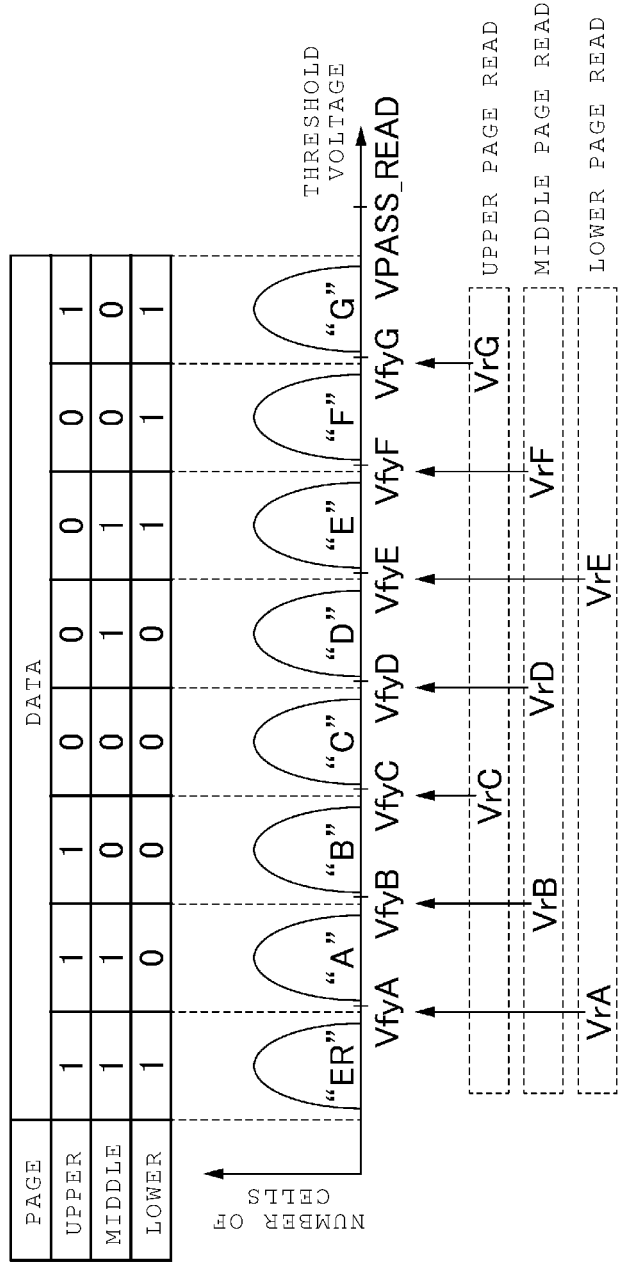
FIG. 7 is a diagram illustrating an example of a threshold voltage distribution of a memory cell transistor.

FIG. 7 is a diagram schematically illustrating a threshold voltage distribution and the like of the memory cell transistor MT. The drawing in the middle portion of FIG. 7 illustrates the relationship between the threshold voltage (horizontal axis) of the memory cell transistor MT and the number of memory cell transistors MT (vertical axis).

When the TLC method is employed as in the present embodiment, the plurality of memory cell transistors MT form eight threshold voltage distribution s as illustrated in the middle portion of FIG. 7. These eight threshold voltage distributions are referred to as "ER" state, "A" state, "B" state, "C" state, "D" state, "E" state, "F" state, and "G" state in order from the lowest threshold voltage.

The table at the upper portion of FIG. 7 illustrates an example of data assigned correspondingly to each of the states of threshold voltage described above. As illustrated in the corresponding table, the "ER" state, "A" state, "B" state, "C" state, "D" state, "E" state, "F" state, and "G" state are allocated with different 3 bit data as described below, for example.

"ER" state: "111" ("lower bit/middle bit/upper bit")
"A" state: "011"
"B" state: "001"
"C" state: "000"
"D" state: "010"
"E" state: "110"
"F" state: "100"
"G" state: "101"

As described above, the threshold voltage of the memory cell transistor MT in the present embodiment may be set to one of eight preset candidate states, and data is assigned as described above correspondingly to each candidate state.

The verify voltage used in each write operation is set between a pair of threshold voltage distributions adjacent to each other. Specifically, the verify voltages VfyA, VfyB, VfyC, VfyD, VfyE, VfyF, and VfyG are set correspondingly for the "A" state, "B" state, "C" state, "D" state, "E" state, "F" state, and "G" state, respectively.

The verify voltage VfyA is set between a maximum threshold voltage at the "ER" state and a minimum threshold voltage at the "A" state. When the verify voltage VfyA is applied to the word line WL, among the memory cell transistors MT connected to the corresponding word line WL, a memory cell transistor MT having threshold voltage provided in the "ER" state is turned on, and a memory cell transistors MT having threshold voltage provided in the threshold voltage distribution of "A" state or higher is turned off.

Other verify voltages VfyB, VfyC, VfyD, VfyE, VfyF, and VfyG are also set in the same manner as the verify voltage VfyA described above. The verify voltage VfyB is set between the "A" state and the "B" state, the verify voltage VfyC is set between the "B" state and the "C" state, the verify voltage VfyD is set between the "C" state and the "D" state, the verify voltage VfyE is set between the "D" state and the "E" state, the verify voltage VfyF is set between the "E" state and the "F" state, and the verify voltage VfyG is set between the "F" state and the "G" state.

For example, the verify voltages VfyA, VfyB, VfyC, VfyD, VfyE, VfyF, and VfyG may be set to 0.8 V, 1.6 V, 2.4 V, 3.1 V, 3.8 V, 4.6 V, and 5.6 V, respectively. However, the verify voltages VfyA, VfyB, VfyC, VfyD, VfyE, VfyF, and VfyG are not limited thereto, and may be appropriately and stepwise set in the range of 0 V to 7.0 V, for example.

Further, a read voltage used in each read operation is set between adjacent threshold voltage distributions. The "read voltage" is a voltage applied to the word line WL, that is, to the selected word line connected to the memory cell transistor MT to be read during the read operation. In the read operation, data is determined based on a determination result of whether the threshold voltage of the memory cell transistor MT to be read is higher than the applied read voltage.

As schematically illustrated in the lower drawing of FIG. 7, specifically, the read voltage VrA for determining whether the threshold voltage of the memory cell transistor MT is provided in the "ER" state or above the "A" state is set between the maximum threshold voltage at the "ER" state and the minimum threshold voltage at the "A" state.

Other read voltages VrB, VrC, VrD, VrE, VrF, and VrG are also set in the same manner as the read voltage VrA described above. The read voltage VrB is set between the "A" state and the "B" state, the read voltage VrC is set between the "B" state and the "C" state, the read voltage VrD is set between the "C" state and the "D" state, the read voltage VrE is set between the "D" state and the "E" state, the read voltage VrF is set between the "E" state and the "F" state, and the read voltage VrG is set between the "F" state and the "G" state.

Then, a read pass voltage VPASS_READ is set to a voltage higher than the maximum threshold voltage of the highest threshold voltage distribution (for example, "G" state). A memory cell transistor MT applied with the read pass voltage VPASS_READ at its gate is turned on regardless of the data stored therein.

The verify voltages VfyA, VfyB, VfyC, VfyD, VfyE, VfyF, and VfyG are set to higher voltages than the read voltages VrA, VrB, VrC, VrD, VrE, VrF, and VrG, respectively, for example. That is, the verify voltages VfyA, VfyB, VfyC, VfyD, VfyE, VfyF, and VfyG are set near the lower portion of the threshold voltage distribution of "A" state, "B" state, "C" state, "D" state, "E" state, "F" state, and "G" state, respectively.

When the data assignment as described above is applied, the one-page data (lower page data) of the lower bits in the read operation can be determined by the read result obtained by using the read voltages VrA and VrE. The one-page data of the middle bit (middle page data) can be determined by the read result obtained by using the read voltages VrB, VrD, and VrF. The one-page data of the upper bit (upper page data) can be determined by the read result obtained by using the read voltages VrC and VrG. As described above, since the lower page data, the middle page data, and the upper page data are determined by two, three, and two read operations, respectively, the above data assignment is referred to as "2-3-2 code".

The data assignment as described above is only an example, and the actual data assignment is not limited thereto. For example, 2 bits or 4 bits or more of data may be stored in one memory cell transistor MT. Further, the number of threshold voltage distributions to which data is allocated (that is, the number of "candidate states" described above) may be 7 or less, or 9 or more. For example, "1-3-3 code" or "1-2-4 code" may be used instead of "2-3-2 code". Further, for example, the assignment of the lower bit/middle bit/upper bit may be changed. More specifically, for example, in the "2-3-2 code", data may be assigned such that the lower page data is determined by the read result obtained by using the read voltages VrC and VrB, the middle page data is determined by the read result obtained by using the read voltages VrB, VrD, and VrF, and the upper page data is determined by the read result obtained by using the read voltages VrA and VrE. That is, for example, the assignment of the lower bit and the upper bit may be reversed. In this case, data is assigned correspondingly to each state of the threshold voltage as follows.

"ER" state: "111" ("lower bit/middle bit/upper bit")
"A" state: "110"
"B" state: "100"
"C" state: "000"
"D" state: "010"
"E" state: "011"
"F" state: "001"
"G" state: "101"

The write operation performed in the semiconductor memory device 2 will be described. In the write operation, the program operation and the verify operation are performed. The "program operation" is an operation of changing the threshold voltage of the corresponding memory cell transistor MT by injecting electrons into the charge storage layer 336 of some memory cell transistors MT. The "verify operation" is an operation of reading data after the program operation described above and determining and verifying whether the threshold voltage of the memory cell transistor MT has reached the target state. A memory cell transistor MT having threshold voltage reaching the target state is write-protected from then on. The "target state" described above is a specific candidate state set as a target state from the eight candidate states described above.

In the write operation, the program operation and verify operation described above are repeatedly executed. As a result, the threshold voltage of the memory cell transistor MT is increased to the target state.

Among the plurality of word lines WL, a word line WL connected to the memory cell transistor MT that is the target of the write operation (that is, the target for changing the threshold voltage) is also referred to as "selected word line" below. Further, a word line WL connected to the memory cell transistor MT that is not the target of the write operation is also referred to as "non-selected word line" below. A memory cell transistor MT to be written is also referred to as a "selected memory transistor" below.

Among the plurality of string units SU, a string unit SU that is the target of the write operation is also referred to as a "selected string unit" below. Further, the string unit SU that is not the target of the write operation is also referred to as a "non-selected string unit" below.

The conductive column 338 of each NAND string NS in the selected string unit, that is, each channel in the selected string unit is also referred to as "selected channel" below. Further, the conductive column 338 of each NAND string NS in the non-selected string unit, that is, each channel in the non-selected string unit is also referred to as "non-selected channel" below.

Among the plurality of bit lines BL, a bit line BL connected to the selected memory transistor is also referred to as a "selected bit line" below. Further, a bit line BL not connected to the selected memory transistor is also referred to as "non-selected bit line" below.

Figure 8:
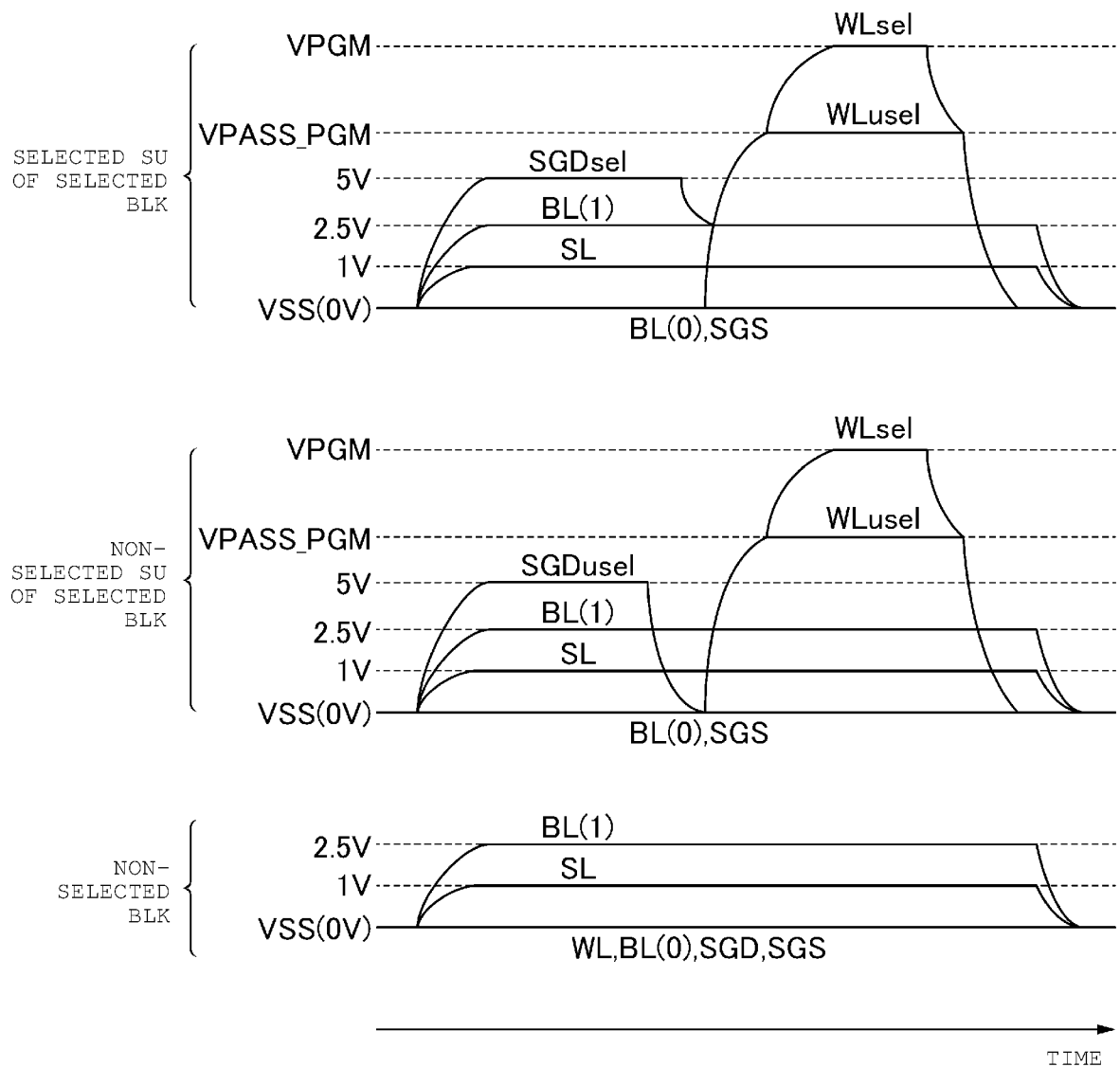
FIG. 8 is a diagram illustrating a voltage change of each wiring during a write operation.

The program operation will be described. FIG. 8 illustrates a voltage change of each wiring during the program operation. In the program operation, the sense amplifier 120 changes the voltage of each bit line BL according to the program data. For example, a ground voltage Vss (0 V) is applied as the "L" state to the bit line BL connected to the memory cell transistor MT to be programmed (i.e., having threshold voltage to be raised). For example, 2.5 V is applied as the "H" state to the bit line BL connected to the memory cell transistor MT that is not the program target (i.e., memory cell transistor MT having a threshold voltage that is to be maintained). The former bit line BL is marked as "BL(0)" in FIG. 8. The latter bit line BL is marked as "BL(1)" in FIG. 8.

The row decoder 130 selects a block BLK as the target of the write operation, and further selects a string unit SU. More specifically, for example, 5 V is applied to the select gate line SGD (selected select gate line SGDsel) in the selected string unit SU from the voltage generation circuit 43 via the row decoder 130. As a result, the select transistor ST1 is turned on. Meanwhile, for example, voltage Vss is applied to the select gate line SGS from the voltage generation circuit 43 via the row decoder 130. As a result, the select transistor ST2 is turned off.

Further, for example, a voltage of 5 V is applied to the select gate line SGD (non-selected select gate line SGDusel)

of the non-selected string unit SU in the selected block BLK from the voltage generation circuit 43 via the row decoder 130. As a result, the select transistor ST1 is turned on. In the string unit SU in each block BLK, the select gate lines SGS are commonly connected. Therefore, also in the non-selected string unit SU, the select transistor ST2 is turned off.

Further, for example, voltage Vss is applied to the select gate line SGD and the select gate line SGS in the non-selected block BLK from the voltage generation circuit 43 via the row decoder 130. As a result, the select transistor ST1 and the select transistor ST2 are turned off.

The source line SL has a voltage higher than the voltage of the select gate line SGS. The corresponding voltage is 1 V, for example.

Then, the voltage of the selected select gate line SGDsel in the selected block BLK is set to 2.5 V, for example. This voltage is a voltage at which the select transistor ST1 corresponding to the bit line BL(0) applied with 0 V in the above example is turned on, but the select transistor ST1 corresponding to the bit line BL(1) applied with 2.5 V is cut off. As a result, in the selected string unit SU, the select transistor ST1 corresponding to the bit line BL(0) is turned on, and the select transistor ST1 corresponding to the bit line BL(1) applied with 2.5 V is cut off. Meanwhile, the voltage of the non-selected select gate line SGDusel is set to a voltage Vss, for example. As a result, in the non-selected string unit SU, the select transistor ST1 is cut off regardless of the voltages of the bit lines BL(0) and BL(1).

Then, the row decoder 130 selects a word line WL as the target of the write operation in the selected block BLK. For example, a voltage VPGM is applied to the word line WL (selected word line WLsel) to be the target of the write operation from the voltage generation circuit 43 via the row decoder 130. Meanwhile, for example, the voltage VPASS_PGM is applied to the other word lines WL (non-selected word lines WLusel) from the voltage generation circuit 43 via the row decoder 130. The voltage VPGM is a high voltage for injecting electrons into the charge storage layer 336 by the tunnel phenomenon. The voltage VPASS_PGM has such a magnitude that it turns on the memory cell transistor MT connected to the word line WL while not changing the threshold voltage. The VPGM has a higher voltage than the VPASS_PGM.

In the NAND string NS corresponding to the bit line BL(0) to be programmed, the select transistor ST1 is turned on. Therefore, the channel voltage of the memory cell transistor MT connected to the selected word line WLsel is 0 V. The voltage difference between the control gate and the channel is increased, and as a result, electrons are injected into the charge storage layer 336, and thus the threshold voltage of the memory cell transistor MT is increased.

In the NAND string NS corresponding to the bit line BL(1) which is not the program target, the select transistor ST1 is in the cutoff state. Therefore, the channel of the memory cell transistor MT connected to the selected word line WLsel is in an electrically floating state, and the channel voltage is increased near the voltage VPGM by capacitive coupling with the word line WL or the like. The voltage difference between the control gate and the channel is decreased, and as a result, electrons are not injected into the charge storage layer 336, and thus the threshold voltage of the memory cell transistor MT is maintained. To be precise, the threshold voltage is not changed to such an extent that the threshold voltage distribution state transitions to a higher state.

Figure 9:
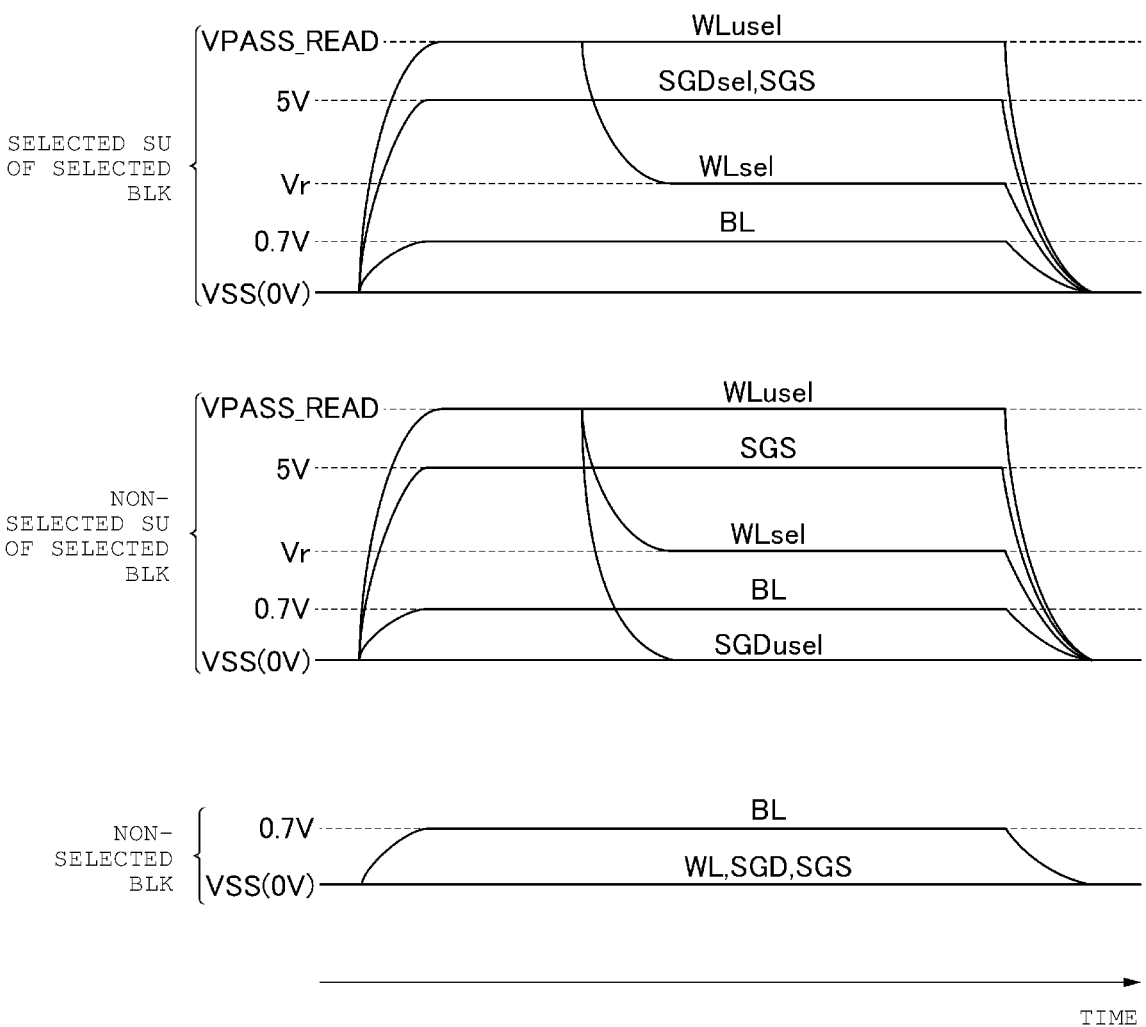
FIG. 9 is a diagram illustrating a voltage change of each wiring during a read operation.

The read operation will be described. The verify operation that follows the program operation is the same as the read operation described below. FIG. 9 illustrates a voltage change of each wiring during the read operation. In the read operation, the NAND string NS including the memory cell transistor MT, which is the target of the read operation, is selected. Alternatively, the string unit SU including the page, which is the target of the read operation, is selected.

First, for example, 5 V is applied to the selected select gate line SGDsel, the non-selected select gate line SGDusel, and the select gate line SGS, from the voltage generation circuit 43 via the row decoder 130. As a result, the select transistors ST1 and ST2 in the selected block BLK are turned on. Further, for example, a read pass voltage VPASS_READ is applied to the selected word line WLsel and the non-selected word line from the voltage generation circuit 43 via the row decoder 130. The read pass voltage VPASS_READ has such a magnitude that it can turn on the memory cell transistor MT regardless of the threshold voltage of the memory cell transistor MT while not changing the threshold voltage. As a result, the current flows in all the NAND strings NS in the selected block BLK regardless of whether it is the selected string unit SU or the non-selected string unit SU.

Next, for example, a read voltage Vr such as VrA is applied to the word line WL (selected word line WLsel) connected to the memory cell transistor MT, which is the target of the read operation from the voltage generation circuit 43 via the row decoder 130. The read pass voltage VPASS_READ is applied to the other word lines (non-selected word lines WLusel).

Further, for example, a voltage Vss is applied to the non-selected select gate line SGDusel from the voltage generation circuit 43 via the row decoder 130, while the voltage applied to the selected select gate line SGDsel and the select gate line SGS is maintained. As a result, the select transistor ST1 in the selected string unit SU is maintained in an on state, but the select transistor ST1 in the non-selected string unit SU is turned off. The select transistor ST2 in the selected block BLK is turned on regardless of whether it is the selected string unit SU or the non-selected string unit SU.

As a result, the NAND string NS in the non-selected string unit SU does not form a current path because at least the select transistor ST1 is turned off. Meanwhile, the NAND string NS in the selected string unit SU forms or does not form a current path according to the relationship between the read voltage Vr applied to the selected word line WLsel and the threshold voltage of the memory cell transistor MT.

The sense amplifier 120 applies a voltage to the bit line BL connected to the selected NAND string NS. In this state, the sense amplifier 120 reads out data based on the value of the current flowing through the corresponding bit line BL. Specifically, it is determined whether the threshold voltage of the memory cell transistor MT, which is the target of the read operation, is higher than the read voltage applied to the corresponding memory cell transistor MT. The data may be read out not based on the value of the current flowing through the bit line BL, but also based on the time change of the voltage at the bit line BL. In the latter case, the bit line BL is precharged so as to have a predetermined voltage in advance.

The verify operation described above is also performed in the same manner as the read operation as described above. In the verify operation, for example, a verify voltage such as VfyA is applied to the word line WL connected to the memory cell transistor MT to be verified, from the voltage generation circuit 43 via the row decoder 130.

The operation of applying a voltage of 5 V to the selected select gate line SGDsel and the non-selected select gate line SGDusel in the initial stage of the program operation described above may be omitted. Likewise, the operation of applying a voltage of 5 V to the non-selected select gate line SGDusel and applying the read pass voltage VPASS_READ to the selected word line WLsel in the initial stage of the read operation (verify operation) described above may be omitted.

FIG. 10A illustrates an example of time change of the current supplied to the memory cell array 110 from the voltage generation circuit 43 in order to change the voltage of each word line WL. The corresponding current is also referred to as "Icc" below.

A line L01 in FIG. 10B illustrates an example of the time change of the voltage at the selected select gate line SGDsel. The corresponding voltage is also referred to as "V_SGD_sel" below. Further, a line L02 shown in FIG. 10B illustrates an example of the time change of the voltage at the non-selected select gate line SGDusel. The corresponding voltage is also referred to as "V_SGD_usel" below.

FIG. 10C illustrates an example of the time change of the voltage at the selected word line WLsel. The corresponding voltage is also referred to as "V_WL_sel" below. FIG. 10D illustrates an example of the time change of the voltage at the non-selected word line WLusel. The corresponding voltage is also referred to as "V_WL_usel" below.

FIG. 10E illustrates an example of the time change of the voltage at the selected channel belonging to the selected string unit corresponding to the selected select gate line SGDsel. The corresponding voltage is also referred to as "V_Ch_sel" below. A line L11 illustrates an example of the time change of the voltage at the selected channel that is not connected to the selected memory transistor (in other words, connected to the non-selected bit line). A line L12 illustrates an example of the time change of the voltage at the selected channel that is connected to the selected memory transistor (in other words, connected to the selected bit line).

FIG. 10F illustrates an example of the time change of the voltage at the bit line BL. The corresponding voltage is also referred to as "V_BL" below. A line L21 illustrates an example of the time change of the voltage at the non-selected bit line among the plurality of bit lines BL. A line L22 illustrates an example of the time change of the voltage at the selected bit line among the plurality of bit lines BL.

FIG. 10G illustrates an example of the time change of the voltage at the non-selected channel belonging to the non-selected string unit corresponding to the non-selected select gate line SGDusel. The corresponding voltage is also referred to as "V_Ch_usel" below. A line L31 illustrates an example of the time change of the voltage of the non-selected channel connected to the non-selected bit line. A line L32 illustrates an example of the time change of the voltage of the non-selected channel connected to the selected bit line.

In the example of FIGS. 10A-10G, the program operation is started at time t1. The sequencer 41 increases V_SGD_sel (line L01) and V_SGD_usel (line L02) from 0 V to 5 V, for example, during a period from time t1 to time t2. As a result, each select transistor ST1 of the selected string unit and each select transistor ST1 of the non-selected string unit are turned on, respectively.

At time t2, the sequencer 41 increases the voltage of the non-selected bit line to 2.5 V as illustrated by the line L21 in FIG. 10F. As a result, the voltage at the selected channel connected to the non-selected bit line is increased to 2.5 V as illustrated by the line L11 in FIG. 10E. It should be noted that, although not illustrated, the select transistor ST2 is turned off during a period when the program operation is performed.

Then, the sequencer 41 once decreases V_SGD_sel (line L01), and then changes V_SGD_sel to 2.5 V and also changes V_SGD_usel (line L02) to 0 V during a period from time t3 to time t4 (FIG. 10B).

As illustrated in FIGS. 10B and 10F, after time t4, V_SGD_sel is the same voltage as the voltage (2.5 V) at the non-selected bit line. Therefore, the select transistor ST1 connected to the non-selected bit line in the selected string unit is cut off and turned off. Meanwhile, V_SGD_sel (line L01) is higher than the voltage (0 V) in the selected bit line. Therefore, the select transistor ST1 connected to the selected bit line in the selected string unit is turned on. It should be noted that since V_SGD_usel (line L02) is lower than the voltage (2.5 V) at the non-selected bit line and is the same voltage as the voltage (0 V) at the selected bit line, all the select transistors ST1 in the non-selected string unit are turned off.

As a result, the selected channel connected to the non-selected bit line is in an electrically floating state after the time t4 due to the select transistor ST1 being turned off. Meanwhile, the selected channel connected to the selected bit line is electrically connected to the selected bit line after the time t4 due to the select transistor ST1 being turned on.

Then, during a period from time t5 to time t6, the sequencer increases each voltage of the word line WL to VPASS_PGM. VPASS_PGM has a voltage having a magnitude such that it turns on the memory cell transistor MT regardless of the threshold voltage of the memory cell transistor MT, and it is 10 V, for example. As illustrated in FIGS. 10C and 10D, at time t6, both V_WL_sel and V_WL_usel are in a state of rising to VPASS_PGM. As illustrated in FIG. 10A, after time t5, Icc is temporarily increased as the voltage of the word line WL is increased.

The selected channel connected to the non-selected bit line is in an electrically floating state as described above. In this state, when the voltage of each word line WL is increased to VPASS_PGM, the voltage of the corresponding selected channel is also increased due to the capacitive coupling between the word line WL and the corresponding selected channel. The voltage V_Ch_sel of the selected channel connected to the non-selected bit line is increased to V_IH1 as illustrated by line L11 in FIG. 10E, for example. V_IH1 has a voltage substantially the same as that of VPASS_PGM. The voltage V_Ch_usel of the non-selected channel connected to the non-selected bit line is also increased to V_IH1 as illustrated by the line L31 in FIG. 10G. That is, the voltage V_Ch_usel of the non-selected channel connected to the non-selected bit line illustrated by the line L31 of FIG. 10G varies in substantially the same manner as the voltage V_Ch_sel of the selected channel connected to the non-selected bit line illustrated by the line L11 in FIG. 10E.

The non-selected channel connected to the selected bit line is also in an electrically floating state like the non-selected channel connected to the non-selected bit line. In this state, when the voltage of each word line WL is increased to VPASS_PGM, the voltage of the corresponding non-selected channel is also increased due to the capacitive coupling between the word line WL and the corresponding non-selected channel. The voltage V_Ch_usel of the non-selected channel connected to the selected bit line is increased to V_IH2 as illustrated by the line L32 in FIG. 10G. V_IH2 has a voltage that is substantially the same as that of VPASS_PGM, but is lower than V_IH1.

The selected channel connected to the selected bit line is electrically connected to the selected bit line BL as described above. Therefore, even when the voltage of each word line WL is increased to VPASS_PGM, the voltage of the corresponding selected channel is not increased and is maintained at 0 V as illustrated by the line L12 of FIG. 10E.

At time t6, when the voltage of each word line WL is increased to VPASS_PGM, the sequencer 41 further increases V_WL_sel, which is the voltage of the selected word line, to VPGM. VPGM has a voltage having a magnitude such that it increases the threshold voltage of the memory cell transistor MT, and it is 20 V, for example. The voltage of the non-selected word line is maintained at VPASS_PGM.

FIG. 11 illustrates, in an equivalent circuit diagram, a state of the NAND string NS at this time. A pair of NAND strings NS1 and NS2 illustrated in FIG. 11 belong to the same selected string unit. A NAND string NS1 is connected to the selected bit line, and the NAND string NS2 is connected to the non-selected bit line. In the example of FIG. 11, a memory cell transistor MT3 of the NAND string NS1 is the target of the write operation.

After the time t7, in the NAND string NS1, the select transistor ST1 and the memory cell transistor MT are in the on state, and the select transistor ST2 is in the off state. Therefore, the voltage V_Ch_sel of the selected channel connected to the selected bit line is 0 V.

In the NAND string NS1, the memory cell transistors MT0 to MT2 and MT4 to MT7 that are not the target of write have a voltage difference of about 10 V between the non-selected word line (VPASS_PGM) connected to the gate and the selected channel (0 V) therein. Therefore, these memory cell transistors MT are only in the on state, and their threshold voltages are not changed.

Meanwhile, in the NAND string NS1, the memory cell transistor MT3 to be written has a relatively high voltage difference of 20 V between the selected word line (VPGM) connected to the gate and the selected channel (0 V) therein. Therefore, the threshold voltage of the memory cell transistor MT3 is changed, and data is written.

In the NAND string NS2 connected to the non-selected bit line, as described above, both the select transistors ST1 and ST2 are in the off state. Therefore, the selected channel connected to the non-selected bit line is in an electrically floating state. The voltage difference between the word line WL (VPASS_PGM or VPGM) connected to the gate of each memory cell transistor MT and the selected channel (V_IH1) therein is in a range of about 0 V to 10 V. Therefore, these memory cell transistors MT are only in the on state, and their threshold voltages are not changed. The same applies to the NAND string NS belonging to the non-selected string unit, and the threshold voltage of each memory cell transistor MT in the corresponding NAND string NS is not changed.

As described above, when the program operation is executed, the plurality of selected channels in the selected string unit are divided into channels that are maintained at 0 V and channels that are increased to V_IH1. The channel maintained at 0 V, that is, the channel connected to the memory cell transistor MT to which the data is written is also referred to as "channel PG" below. Further, the channel that is not increased to V_IH1, that is, the channel that is not connected to the memory cell transistor MT to which data is written is also referred to as "channel IH" below. Each of the numbers of channels PG and channels IH belonging to the selected string unit is changed each time according to the data written on the page and the number of loops described below.

It should be noted that all of the plurality of non-selected channels in the non-selected string unit are increased to at least V_IH2 in the program operation. That is, in the program operation, the voltage V_Ch_usel of the non-selected channel connected to the selected bit line is increased to V_IH2, and the voltage V_Ch_usel of the non-selected channel connected to the non-selected bit line is increased to V_IH1 that is higher than V_IH2. The number of non-selected channels belonging to the non-selected string unit having voltages increased to V_IH2 and the number of non-selected channels having voltages increased to V_IH1 are changed each time according to the data written on the page and the number of loops.

The description will be continued with reference to FIGS. 10A-10G again. When the voltage V_WL_sel of the selected word line is set to VPGM at time t7, the data is written as described above. The corresponding state is continuously maintained for a certain period until time t8. The program operation ends at time t8, and the verify operation follows.

In the verify operation, the sequencer 41 increases the voltage V_SGD in the select gate line SGD to 5 V, for example (FIG. 10B). Further, the voltage V_BL of the bit line BL is changed to 1 V, for example (FIG. 10F). It should be noted that such switching of V_BL is performed for both the selected bit line and the non-selected bit line.

At the same time, the sequencer 41 changes the voltage V_WL_sel in the selected word line from VPGM to VPASS_READ. Then, at a time t9, the sequencer 41 changes the voltage V_WL_sel on the selected word line from VPASS_READ to Vcgrv (FIG. 10C). Vcgrv has a voltage having a magnitude selected from VfyA, VfyB, and the like in FIG. 7 according to the candidate state to be verified. A method for setting a candidate state to be verified will be described below.

Further, the sequencer 41 changes the voltage V_WL_usel in the non-selected word line from VPASS_PGM to VPASS_READ (FIG. 10D). VPASS_READ has a voltage having a magnitude such that it turns on the memory cell transistor MT regardless of the threshold voltage of the memory cell transistor MT, and it is 5 V, for example.

The change of the voltage of each wiring as described above is performed substantially simultaneously by the sequencer 41 in the period after the time t8 when the verify operation is started.

At time t9 after time t8, the sequencer 41 decreases V_SGD_usel (line L02) from 5 V to 0 V, for example. After time t9, the select transistor is turned on as V_SGD is increased to 5 V, and each bit line BL and the selected channel are electrically connected to each other. Therefore, both V_Ch_sel and V_Ch_usel are changed to 1 V which is the same as the voltage of the bit line BL.

In the state at time t9, when the threshold voltage of the memory cell transistor MT to be verified is higher than Vcgrv, the corresponding memory cell transistor MT is turned off, and no current flows through the channel PG including the corresponding memory cell transistor ST. Meanwhile, when the threshold voltage of the memory cell transistor MT to be verified is lower than Vcgrv, the corresponding memory cell transistor ST is turned on and a current flows through the channel PG including the corresponding memory cell transistor MT. Each current value can be detected by the sense amplifier 120. The sequencer 41 can determine whether the threshold voltage of the memory cell transistor MT reaches the target state based on the current flowing through the channel PG. Then, when the verify operation is completed at time t10, the sequencer 41 decreases the V_SGD_sel (line L01) in FIG. 10B from 5 V to 0 V and also decreases the V_WL_sel in FIG. 10C from Vcgrv to 0 V.

It should be noted that the example of FIGS. 10A-10G is an example in which the verify operation is performed for a single state. That is, as illustrated in FIG. 10C, after V_WL_sel is set to Vcgrv at time t9, the verify operation is performed only for a single state that corresponds to the voltage. As will be described below, after time t9, Vcgrv is adjusted to change stepwise, and the verify operation may be performed for a plurality of states according to each stage.

Figure 12:
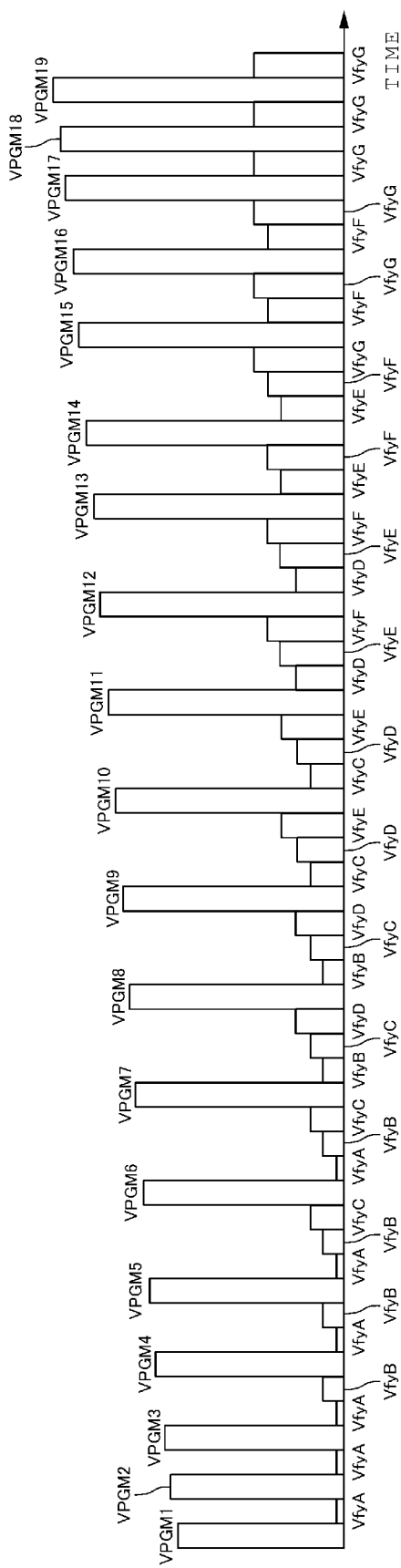
FIG. 12 is a diagram illustrating a voltage change of a word line during the write operation.

The specific flow of the entire write operation will be described. In the write operation, the program operation and verify operation as described above are repeated until it is confirmed that the data is written correctly. FIG. 12 illustrates an example in which data is written by repeating the combination of the program operation and the verify operation 19 times. Each operation repeated as described above is also referred to as a "loop" below.

FIG. 12 illustrates an example of the voltage change of the selected word line during the write operation. As illustrated in this drawing, the loop described above is executed up to 19 times. It should be noted that the "VPGM1" illustrated in FIG. 12 is a VPGM applied to the selected word line in the first loop. "VPGM2" is a VPGM applied to the selected word line in the second loop. As follow, the VPGM applied to the selected word line in each loop is marked as "VPGM3", "VPGM4", . . . , "VPGM19" in FIG. 12. As illustrated in this drawing, each time the loop is repeated, the value of VPGM is stepped up to gradually increase.

FIG. 13 illustrates a target state of the verify operation performed in each loop. Further, FIG. 14 illustrates a target state of the program operation performed in each loop. In addition, "1" illustrated in FIG. 14 means that the write operation at the corresponding state is not performed, and "0" means that the write operation is performed at the corresponding state. Further, "0/1" means that the write operation at the corresponding state is basically performed, but, when having passed the verify operation during the previous write operation, the write operation is not performed.

As illustrated in FIGS. 12, 13, and 14, in the first loop in these examples, after VPGM1 is applied to the selected word line in the program operation, the verify operation is performed only for the "A" state. That is, during the verify operation, the verify voltage VfyA is applied to the selected word line, and the verify voltages VfyB to VfyG are not applied thereto.

The memory cell transistor MT to be programmed in the first loop are all memory cell transistors MT that eventually should have a threshold voltage of the "A" state or higher. Meanwhile, the memory cell transistor MT to be verified by the "A" state in the first loop is the memory cell transistor MT eventually having threshold voltage of the "A" state. The memory cell transistor MT eventually having threshold voltage of the "B" state or higher is excluded from the target to be verified by the "A" state.

In the second loop, after VPGM2 is applied to the selected word line, the same program operation and verify operation as in the first loop are performed. However, among the memory cell transistors MT eventually having threshold voltage of the "A" state, those that pass the verify operation by the "A" state in the first loop are excluded from the target of the program operation and the verify operation in the second loop. That is, in the second loop, the memory cell transistor MT eventually having threshold voltage of the "B" state or higher, and the memory cell transistor MT that failed to verify in the previous loop are the targets of the program operation.

In the third loop, after VPGM3 is applied to the selected word line and the program operation is performed, the verify operation is performed for the "A" state and the "B" state. That is, during the verify operation, the verify voltages VfyA and VfyB are sequentially applied to the selected word line, and the verify voltages VfyC to VfyG are not applied thereto.

The memory cell transistors MT to be programmed in the third loop are all memory cell transistors MT that eventually should have a threshold voltage of the "B" state or higher, and the memory cell transistor MT that failed to verify in the previous loops. Further, the memory cell transistors MT to be verified by the "A" state in the third loop are the memory cell transistors MT that failed to verify in the previous loops among the memory cell transistors MT eventually having threshold voltage of the "A" state. The memory cell transistor MT to be verified by the "B" state in the third loop corresponds to the memory cell transistors MT eventually having threshold voltage of the "B" state.

In the fourth loop, after VPGM4 is applied to the selected word line, the same program operation and verify operation as in the third loop are performed. However, among the memory cell transistors MT eventually having threshold voltage of the "A" state, the memory cell transistors MT that pass the verify operation by the "A" state in the third loop are excluded from the target of the program operation and the verify operation in the second loop. Likewise, those that pass the verify operation by the "B" state in the third loop are excluded from the target of the program operation and the verify operation in the fourth loop. That is, in the fourth loop, the memory cell transistor MT eventually having threshold voltage of the "C" state or higher, and the memory cell transistor MT that failed to verify in the previous loops are the targets for the program operation.

Likewise, in the subsequent loops, after the program operation, the verify operations by each of the predetermined states as illustrated in FIG. 7 are performed. The memory cell transistors MT having threshold voltage reaching the final target state are excluded from the target of the program operation and the verify operation in the subsequent loops.

As the loop is repeated, since the memory cell transistors MT having threshold voltage reaching the final target state are increased, the number of memory cell transistors MT that are excluded from the target of the program operation and the verify operation is gradually increased. This can also be seen in FIG. 14, in which the number of states marked with "1" is increased and the number of states marked with "0" is increased as the number of loops is increased.

In the example illustrated in FIG. 13, the verify operation with respect to the "A" state as the target is completed in the sixth loop. This is because, for example, the characteristics of the memory cell array 110 previously obtained show that the writing of data to the "A" state is almost completed after a total of 6 loops. Likewise, in the example illustrated in FIG. 13, the verify operation with respect to the "B" state as the target is completed in the eighth loop. This is because it is known that the writing of data to the "B" state is almost completed after a total of 6 loops from the third to eighth loops.

The writing of data to each candidate state does not have to be fully completed. For example, among the memory cell transistors MT that eventually should have a threshold voltage of the "A" state, even when there remain the memory cell transistors MT having threshold state not reaching the "A" state, if the number of those memory cell transistors MT is less than a certain number, the program operation and the verify operation by the "A" state are not performed for those memory cell transistors MT. This is because, even when there remain some memory cell transistors MT that have threshold voltage not reaching the target candidate state (that is, the data writing is not fully completed), if the number of such is sufficiently small, a semiconductor memory device 10 can be operated normally by the error correction performed by the ECC circuit 14.

For each candidate state, a loop to start the verify operation of the corresponding candidate state and a loop to complete the verify operation of the corresponding candidate state are determined each time according to the bit scan operation performed by the sequencer 41. The "bit scan operation" is an operation performed after the verify operation in each loop, and it is an operation of acquiring the number of memory cell transistors MT having the threshold voltage determined not to have reached the candidate state in the previous verify operation.

For example, in the sixth loop, after the verify operations of the "A" state, the "B" state, and the "C" state are performed, the bit scan operation for each of these states is performed. This bit scan operation individually acquires the number of memory cell transistors MT having the threshold voltage determined not to have reached the "A" state during the verify operation by the "A" state, the number of memory cell transistors MT having the threshold voltage determined not to have reached the "B" state during the verify operation by the "B" state, and the number of memory cell transistors MT having the threshold voltage determined not to have reached the "C" state during the verify operation by the "C" state.

For example, when the number of memory cell transistors MT having the threshold voltage determined not to have reached the "A" state still exceeds a predetermined number set in advance, the sequencer 41 re-executes the verify operation by the "A" state also in the seventh loop. Further, for example, when the number of memory cell transistors MT having the threshold voltage determined not to have reached the "B" state is less than a predetermined number set in advance, the sequencer 41 will not execute the verify operation by the "B" state in the seventh and subsequent loops.

As described above, the sequencer 41 determines for which candidate state the next verify operation is to be performed, based on the result of the bit scan operation. In other words, the sequencer 41 determines the candidate state to be used for the determination in the next verify operation based on the result of the bit scan operation.

Figure 17:
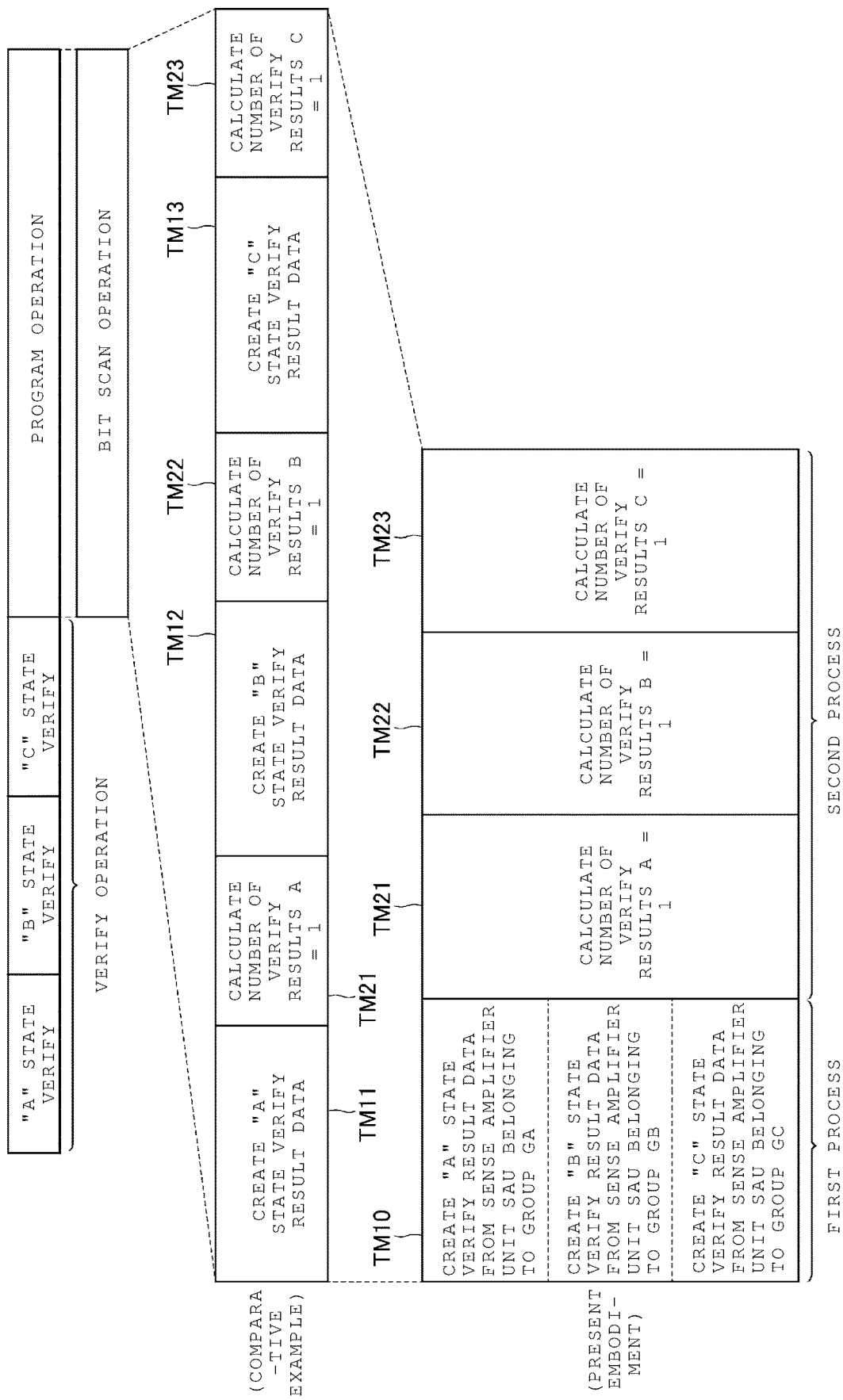
FIG. 17 is a diagram illustrating the contents of a bit scan operation.

In the upper portion of FIG. 17 referenced in the following description, it is illustrated that the program operation of the next loop is performed following the verify operation of each candidate state along the flow of time from the left toward the right side. After the program operation illustrated in FIG. 17 is completed, the verify operation in the same loop is performed. As illustrated in this drawing, the bit scan operation to be performed following the verify operation is performed in parallel with the program operation in the next loop. Specifically, the sequencer 41 is configured to perform a bit scan operation in a period from the completion of the verify operation to the start of the verify operation in the next loop. In the verify operation to be performed after the program operation illustrated in FIG. 17, it is determined whether to continue the verify operation of each state based on the result of the bit scan operation performed in parallel with the program operation.

It should be noted that the bit scan operation does not have to be performed in parallel with the program operation. For example, the bit scan operation may be performed following the verify operation, and after the corresponding bit scan operation is completed, the program operation and the verify operation in the next loop may be performed.

The specific operation of the sense amplifier unit SAU during the program operation and the verify operation will be described. Here, four sense amplifier units SAU101, SAU102, SAU103, and SAU104 among the plurality of sense amplifier units SAU in the sense amplifier 120 will be described. As schematically illustrated in FIG. 15, a sense amplifier unit SAU101 is connected to a bit line BL101, a sense amplifier unit SAU102 is connected to a bit line BL102, a sense amplifier unit SAU103 is connected to a bit line BL103, and a sense amplifier unit SAU104 is connected to a bit line BL104. The sense amplifier units SAU101, SAU102, SAU103, and SAU104, and the bit lines BL101, BL102, BL103, and BL104 are schematic and have nothing to do with the actual layout.

In this example, by the program operation performed below, the threshold voltage of the memory cell transistor MT connected from the sense amplifier unit SAU101 via the bit line BL101 is set to the "ER" state, the threshold voltage of the memory cell transistor MT connected from the sense amplifier unit SAU102 via the bit line BL102 is set to the "A" state, the threshold voltage of the memory cell transistor MT connected from the sense amplifier unit SAU103 via the bit line BL103 is set to the "B" state, and the threshold voltage of the memory cell transistor MT connected from the sense amplifier unit SAU104 via the bit line BL104 is set to the "C" state.

In this case, prior to the program operation, the latch circuit of each sense amplifier unit SAU saves the data corresponding to the target threshold voltage (that is, the target state) in advance. For example, since the sense amplifier unit SAU102 changes the threshold voltage of the memory cell transistor MT to the "A" state, the latch circuit of the sense amplifier unit SAU102 saves data of "011" ("lower bit/middle bit/upper bit") corresponding to the "A" state in advance. Specifically, the latch circuit ADL saves "1" corresponding to the upper bit, the latch circuit BDL saves "1" corresponding to the middle bit, and the latch circuit CDL saves "0" corresponding to the lower bit. The same applies to the other sense amplifier units SAU.

In the sense amplifier 120 of the semiconductor memory device 10 according to one embodiment, the sense amplifier unit SAU storing "0" in any of the latch circuits ADL, BDL, and CDL applies 0 V to the bit line BL connected thereto during the program operation. That is, the operation of increasing the threshold voltage of the memory cell transistor MT is performed. Meanwhile, the sense amplifier unit SAU storing "1" in all of the latch circuits ADL, BDL, and CDL applies 2.5 V to the bit line BL connected thereto during the program operation. That is, the operation of maintaining the threshold voltage of the memory cell transistor MT is performed.

Since each sense amplifier unit SAU is configured to perform the operation as described above, in the memory cell transistor MT connected to the sense amplifier unit SAU storing "111" in the latch circuit, the threshold voltage is not changed before and after the program operation. Meanwhile, in the memory cell transistor MT connected to the sense amplifier unit SAU storing data different from "111", in the latch circuit, the threshold voltage is increased due to the program operation. Therefore, when the program operation is performed according to the state illustrated in FIG. 15, the threshold voltage of the memory cell transistor MT connected to the sense amplifier unit SAU101 is maintained, and all the threshold voltages of the memory cell transistors MT connected to the sense amplifier units SAU102, SAU103, and SAU104 are increased.

As described above, the memory cell transistors MT that are subjected to the verify operation and determined that the threshold voltage reaches the target state are write-protected from then on. In the present embodiment, the data stored in the latch circuit of the sense amplifier unit SAU connected to the corresponding memory cell transistor MT is rewritten to "111" corresponding to the "ER" state, so that the corresponding memory cell transistor MT is write-protected.

FIG. 16 illustrates an example of data rewriting as described above. For example, in the memory cell transistor MT connected to the sense amplifier unit SAU102, when it is determined by the verify operation that the threshold voltage reaches the target state "A", the data stored in the latch circuit CDL of the sense amplifier unit SAU102 is rewritten from "0" to "1". Further, for example, in the memory cell transistor MT connected to the sense amplifier unit SAU103, when it is determined by the verify operation that the threshold voltage reaches the target state "B", each of the data stored in the latch circuit BDL and the data stored in the latch circuit CDL of the sense amplifier unit SAU103 is rewritten from "0" to "1".

The bit scan operation will be described. As described above, the "bit scan operation" is an operation of acquiring the number of memory cell transistors MT having the threshold voltage determined not to have reached the candidate state in the previous verify operation. The bit scan operation is performed for each candidate state used to determine the verify operation. For example, the bit scan operation after the sixth loop of the example illustrated in FIG. 13 is completed is performed for each of the "A", "B", and "C" states.

This bit scan operation individually acquires the number of memory cell transistors MT having the threshold voltage determined not to have reached the "A" state yet in the verify operation, the number of memory cell transistors MT having the threshold voltage determined not to have reached the "B" state yet in the verify operation, and the number of memory cell transistors MT having the threshold voltage determined not to have reached the "C" state yet in the verify operation.

In the bit scan operation, the sequencer 41 sequentially performs two processes including the first and the second processes.

In the first process, verify result data is created. The "verify result data" is data indicating whether each of the memory cell transistors MT additionally requires the program operation and the verify operation. The verify result data is created individually for each of the candidate states used to determine the immediately preceding verify operation. In the present embodiment, when the program operation and the verify operation are additionally required, "1" is created as the verify result data, and when the program operation and the verify operation are not additionally required, "0" is created as the verify result data.

For example, for a specific memory cell transistor MT, the target state for the memory cell transistor MT is the "A" state, and it is determined that the threshold voltage has not yet reached the "A" state in the verify operation performed immediately previously. In this case, verify result data of "1" is created for the "A" state of the corresponding memory cell transistor MT. On the other hand, verify result data of "0" is created for the other candidate states of the corresponding memory cell transistor MT.

The lower portion of FIG. 16 illustrates an example of the verify result data created as described above. As illustrated in FIG. 16, the "verify result A" is the verify result data created for the "A" state, the "verify result B" is the verify result data created for the "B" state, and the "verify result C" is the verify result data created for the "C" state.

For example, to describe the sense amplifier unit SAU102 operated with the "A" state as the target state, when the data stored in the latch circuit of the sense amplifier unit SAU102 remains as it is as the initial "011", "1" is created as the verify result data for the "A" state. Then, after it is determined by the verify operation that the threshold voltage of the memory cell transistor MT connected to the sense amplifier unit SAU102 reaches the "A" state, "0" is created as the "A" state verify result data. When the verify result data is created for the candidate states other than the target state, verify result data of "0" is created for all candidate states. As illustrated in FIG. 16, the verify result data is also created for the other sense amplifier units SAU in the same manner as described above.

Here, when the data stored in the latch circuit ADL is marked as "A", the data stored in the latch circuit BDL is marked as "B", and the data stored in the latch circuit CDL is marked as "C", the first process as described above, that is, the creation of the verify result data is implemented by performing the following logical computations in each sense amplifier unit SAU. Verify result A=A and B and (not (C)), verify result B=A and (not (B)) and (not (C)), and verify result C=(not (A)) and (not (B)) and (not (C))

The verify result data created as described above in the first process is temporarily stored in the sense amplifier unit SAU. The verify result data can be stored, for example, in the latch circuit SDL, the latch circuit XDL, or the like in the sense amplifier unit SAU.

By controlling the operation of each sense amplifier unit SAU, the sequencer 41 can create the verify result data by the method as described above and store the verify result data in the latch circuit.

The verify result data may be created in all of the sense amplifier units SAU that are the targets of the write operation, but may be performed only in some of the sense amplifier units SAU. That is, the information stored by the latch circuits of all the sense amplifier units SAU may be estimated by sampling the information stored by the latch circuits of some sense amplifier units SAU. For example, in the first process executed at the time of completion of the sixth loop in the example illustrated in FIG. 13, in the present embodiment, the first process is performed such that among the plurality of sense amplifier units SAU, some groups create verify result data for the "A" state, some other groups create verify result data for the "B" state, and still some other groups create verify result data for the "C" state.

FIG. 6 illustrates an example of the grouping described above. In the group indicated as "GA" in the drawing, "A" state verify result data is created in each sense amplifier unit SAU. Likewise, in the group indicated as "GB", "B" state verify result data is created in each sense amplifier unit SAU, and in the group indicated "GC", "C" state verify result data is created in each sense amplifier unit SAU.

The sense amplifier units SAU belonging to the same group as described above are commonly connected to one or a plurality of control lines CL. As a result, each sense amplifier unit SAU can operate in the same manner, and it is possible to create and store verify result data for the same candidate state.

In this case, verify result data is not created for some of the plurality of memory cell transistors MT for which target state is the "A" state. However, by referring to the verify result data created for only some memory cell transistors MT as described above, it is possible to statistically estimate the total number of memory cell transistors MT having the threshold voltage determined not to have reached yet the "A" state. The same applies to the other candidate states.

In the above, although an example of the first process executed at the time of completion of the sixth loop in the example illustrated in FIG. 13 is described, the first process performed at other time points is also performed in the same manner as described above. For example, when the first process is executed at the time of completion of the sixteenth loop of the example illustrated in FIG. 13, "F" state verify result data is created in some groups of some of the plurality of sense amplifier units SAU, and "G" state verify result data is created in some other groups.

The grouping of a plurality of sense amplifier units SAU may be performed for all sense amplifier units SAU, or may be performed for only some sense amplifier units SAU. That is, there may be a sense amplifier unit SAU that does not belong to any group and for which verify result data is not created.

As described above, in the first process, the sequencer 41 of the present embodiment classifies at least some of the plurality of sense amplifier units SAU into a plurality of groups, and creates verify result data different from each other for each of the groups described above. Further, the sequencer 41 of the present embodiment simultaneously creates the verify result data in each group in parallel. In other words, the sequencer 41 of the present embodiment is configured to create each verify result data in parallel for each of the candidate states different from each other in the first process. As a result, the first process can be completed in a short time.

The second process, which is another process provided in the bit scan operation, is a process of calculating the number of memory cell transistors MT having threshold voltage not reaching the target state based on the verify result data created in the first process. In the second process, the sequencer 41 calculates the total value of the verify result data for each candidate state via the bit detection circuit DTCT, for example. As a result, it is possible to check the number of memory cell transistors MT having the threshold voltage determined not to have reached the corresponding candidate state for each candidate state. Further, it is possible to appropriately set one or a plurality of candidate states used for determining the verify operation in the next loop.

FIG. 17 illustrates a specific process flow of the bit scan operation. In FIG. 17, the middle portion illustrates an example of the bit scan operation according to the comparative example, and the lower portion illustrates an example of the bit scan operation according to the present embodiment. Each example is an example of the bit scan operation that is started at the time of completion of the sixth loop of FIG. 13. That is, FIG. 17 illustrates the flow of process of the bit scan operation when the verify operations of the "A" state, the "B" state, and the "C" state are completed and the corresponding bit scan operation is started in parallel with the program operation of the next seventh loop.

First, the comparative example in the middle portion will be described. In this comparative example, when the verify operation of the sixth loop is completed, the sequencer 41 performs a process of creating "A" state verify result data. The creation of this verify result data may be performed for all sense amplifier units SAU, and may be performed for some of the sense amplifier units SAU as in the range indicated by "GA" in FIG. 6, for example. In FIG. 17, the period during which the "A" state verify result data is created, that is, the period during which the first process is performed is indicated as a period TM11.

When the period TM11 ends and the "A" state verify result data is created, the sequencer 41 performs a process of calculating the number of data having value 1 among the corresponding verify result data. That is, the process of calculating the number of memory cell transistors MT having the "verify result A" of 1 in FIG. 16 is performed. In FIG. 17, the period during which the number of memory cell transistors MT having the verify result A=1 is calculated, that is, the period during which the second process is performed is indicated as a period TM21.

When the second process of the period TM21 ends, the sequencer 41 performs a process of creating "B" state verify result data in the same manner as in the period TM11. In FIG. 17, the period during which the "B" state verify result data is created, that is, the period during which the first process is performed is indicated as a period TM12.

When the period TM12 ends and the "B" state verify result data is created, the sequencer 41 performs a process of calculating the number of data having value 1 among the corresponding verify result data. That is, the process of calculating the number of memory cell transistors MT having the "verify result B" of 1 in FIG. 16 is performed. In FIG. 17, the period during which the number of memory cell transistors MT having the verify result B=1 is calculated, that is, the period during which the second process is performed is indicated as a period TM22.

When the second process of the period TM 22 ends, the sequencer 41 performs a process of creating "C" state verify result data in the same manner as in the period TM 11 and the period TM 12. In FIG. 17, the period during which the "C" state verify result data is created, that is, the period during which the first process is performed is illustrated as a period TM13.

When the period TM13 ends and the "C" state verify result data is created, the sequencer 41 performs a process of calculating the number of data having value 1 among the corresponding verify result data. That is, the process of calculating the number of memory cell transistors MT having the "verify result C" of 1 in FIG. 16 is performed. In FIG. 17, the period during which the number of memory cell transistors MT having the verify result C=1 is calculated, that is, the period during which the second process is performed is indicated as a period TM23.

As described above, in this comparative example, for each candidate state for which the verify operation is performed, the first process of creating the verify result data of the corresponding candidate state and the second process of calculating the number of verify result data having the value 1 are alternately repeated. Therefore, the period required for the entire bit scan operation is relatively long.

Next, the present embodiment illustrated in the lower portion of FIG. 17 will be described. In the present embodiment, as the first process of the bit scan operation, a process of creating "A" state verify result data, a process of creating "B" state verify result data, and a process of creating "C" state verify result data are simultaneously performed in parallel, rather than in order. "The process for creating "A" state verify result data" is created for the sense amplifier unit SAU belonging to the group GA of FIG. 6, for example. "The process for creating "B" state verify result data" is created for the sense amplifier unit SAU belonging to the group GB of FIG. 6, for example. "The process for creating "C" state verify result data" is created for the sense amplifier unit SAU belonging to the group GC of FIG. 6, for example.

That is, in the first process in the present embodiment, verify result data is created in parallel for each of the plurality of candidate states used for determining the verify operation. In FIG. 17, the period of the first process of creating the verify result data of each candidate state as described above is indicated as a period TM10. The length of the period TM10 is substantially the same as the length of each of the periods TM11, TM12, and TM13. At the time of ending of the period TM10, all of the "A" state verify result data, the "B" state verify result data, and the "C" state verify result data are created. That is, in the present embodiment, the first process can be ended in a period of about ⅓ of the comparative example.

When the period TM10 ends and the verify result data of each candidate state is created, the sequencer 41 performs a process of calculating the number of data having a value 1 among the "A" state verify result data. That is, the process of calculating the number of memory cell transistors MT having the "verify result A" of 1 in FIG. 16 is performed. In the lower portion of FIG. 17, the period during which the number of memory cell transistors MT having the verify result A=1 is calculated, that is, the period during which the second process is performed is indicated as a period TM21 as in the comparative example illustrated in the middle portion.

Subsequently, the sequencer 41 performs a process of calculating the number of data having a value 1 among the "B" state verify result data. That is, the process of calculating the number of memory cell transistors MT having the "verify result B" of 1 in FIG. 16 is performed. In the lower portion of FIG. 17, the period during which the number of memory cell transistors MT having the verify result B=1 is calculated, that is, the period during which the second process is performed, is indicated as a period TM22 as in the comparative example illustrated in the middle portion.

Subsequently, the sequencer 41 performs a process of calculating the number of data having a value 1 among the "C" state verify result data. That is, the process of calculating the number of memory cell transistors MT having the "verify result C" of 1 in FIG. 16 is performed. In the lower portion of FIG. 17, the period during which the number of memory cell transistors MT having the verify result C=1 is calculated, that is, the period during which the second process is performed, is indicated as a period TM23 as in the comparative example illustrated in the middle portion.

As described above, in the present embodiment, the second process for each candidate state is continuously performed without being intervened by the first process. The length of the entire period required for the second process, that is, the total length of the periods TM21, TM22, and TM23 is substantially the same as the length in the comparative example.

As described above, in the bit scan operation performed in the present embodiment, the period required for the first process can be shortened as compared with the related art by simultaneously performing the first process for a plurality of candidate states in parallel. As a result, the bit scan operation can reliably end before the program operation illustrated in the upper portion of FIG. 17 ends, and it is possible to prevent a delay in the write operation from occurring.

The verify result data created in the first process may be data having specifications different from those described above, or may be created by a method different from the description described above. In any case, the verify result data may be any data as long as it indicates whether each of the memory cell transistors MT to which the data is written additionally requires the program operation and the verify operation for a specific candidate state.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:
a memory cell array including a plurality of memory cell transistors; and
a control circuit configured to control an operation of the memory cell array, wherein
in a write operation for writing data to the memory cell array, the control circuit executes a loop a plurality of times, each loop including a program operation for changing threshold voltages of some of the memory cell transistors, a verify operation for determining whether the memory cell transistors have reached their respective target threshold voltage states, and a bit scan operation for acquiring the number of memory cell transistors determined not to have reached their respective target threshold voltage states, and
in the bit scan operation, the control circuit performs
a first process of generating verify result data in parallel for a group of memory cell transistors having different target threshold voltage states, the verify result data for each memory cell transistor in the group indicating whether the memory cell transistor has reached its target threshold voltage state, and
a second process of calculating for each of the target threshold voltage states, the number of memory cell transistors that have not reached their target threshold voltage state.

2. The semiconductor memory device according to claim 1, wherein
the target threshold voltage states include a first target threshold voltage state and a second target threshold voltage state, and the plurality of memory cell transistors includes a first number of memory cell transistors to be programmed to at least the first target threshold voltage state and a second number of memory cell transistors to be programmed to at least the second target threshold voltage state, and
the number of memory cell transistors that have not reached the first target threshold voltage state is compared against the first number to determine if the verify operation in the next loop should be performed for the first target threshold voltage, and the number of memory cell transistors that have not reached the second target threshold voltage state is compared against the second number to determine if the verify operation in the next loop should be performed for the second target threshold voltage.

3. The semiconductor memory device according to claim 1, further comprising:
a sense amplifier unit connected to the memory cell transistor via a bit line,
wherein the control circuit generates the verify result data by controlling an operation of the sense amplifier unit.

4. The semiconductor memory device according to claim 3, wherein the verify result data generated in the first process is stored in a latch circuit in the sense amplifier unit.

5. The semiconductor memory device according to claim 4, wherein
a plurality of the sense amplifier units are provided according to the number of memory cell transistors that are targets of the write operation, and
in the first process, the control circuit classifies at least some of the plurality of sense amplifier units into a first group and a second group, and generates a first set of verify result data by controlling the operation of the first group of sense amplifier units and generates a second set of verify result data by controlling the operation of the second group of sense amplifier units.

6. The semiconductor memory device according to claim 1, wherein the control circuit determines the target threshold voltage state to be used in a next verify operation based on the result of the bit scan operation.

7. The semiconductor memory device according to claim 1, wherein the control circuit performs the bit scan operation in a period from a completion of the verify operation of a current loop to a start of the verify operation of a next loop.

8. The semiconductor memory device according to claim 1, wherein the control circuit performs the bit scan operation during a period in which the program operation of a next loop is being executed.

9. A semiconductor memory device, comprising:
a memory cell array; and
a control circuit configured to control an operation of the memory cell array, wherein
in a write operation for writing data to a plurality of memory cell transistors of the memory cell array, the control circuit executes a loop a plurality of times, each loop including a program operation for changing threshold voltages of some of the memory cell transistors, a verify operation for at least determining whether first memory cell transistors have reached a first target threshold voltage state and whether second memory transistors have reached a second target threshold voltage state, and a bit scan operation for at least acquiring the number of first memory cell transistors determined not to have reached the first target threshold voltage state and the number of second memory cell transistors determined not to have reached the second target threshold voltage state, and
in the bit scan operation, the control circuit performs
a first process of generating in parallel first verify result data for each of the first memory cell transistors and second verify result data for each of the second memory cell transistors, the first verify result data for each of the first memory cell transistors indicating whether the first memory cell transistor has reached the first threshold voltage state, and the second verify result data for each of the second memory cell transistors indicating whether the second memory cell transistor has reached the second threshold voltage state, and
a second process of calculating the number of first memory cell transistors that have not reached the first target threshold voltage state and the number of second memory cell transistors that have not reached the second target threshold voltage state.

10. The semiconductor memory device according to claim 9, wherein
the control circuit compares the number of first memory cell transistors that have not reached the first target threshold voltage state against a first number of memory transistors to be programmed to at least the first target threshold voltage state to determine if the verify operation in the next loop should be performed for the first target threshold voltage, and compares the number of second memory cell transistors that have not reached the second target threshold voltage state against a second number of memory transistors to be programmed to at least second target threshold voltage state to determine if the verify operation in the next loop should be performed for the second target threshold voltage.

11. The semiconductor memory device according to claim 9, further comprising:
a sense amplifier unit connected to the memory cell transistor via a bit line,
wherein the control circuit generates the verify result data by controlling an operation of the sense amplifier unit.

12. The semiconductor memory device according to claim 11, wherein the verify result data generated in the first process is stored in a latch circuit in the sense amplifier unit.

13. The semiconductor memory device according to claim 12, wherein
a plurality of the sense amplifier units are provided according to the number of memory cell transistors that are targets of the write operation, and
in the first process, the control circuit classifies at least some of the plurality of sense amplifier units into a first group of sense amplifier units that are connected respectively to the first memory cell transistors and a second group of sense amplifier units that are connected respectively to the second memory cell transistors.

14. The semiconductor memory device according to claim 9, wherein the control circuit performs the bit scan operation in a period from a completion of the verify operation of a current loop to a start of the verify operation of a next loop.

15. The semiconductor memory device according to claim 9, wherein the control circuit performs the bit scan operation during a period in which the program operation of a next loop is being executed.

16. A method of performing a write operation on a plurality of memory cell transistors of a semiconductor memory device, said method comprising:
executing a loop a plurality of times, each loop including a program operation for changing threshold voltages of some of the memory cell transistors, a verify operation for at least determining whether first memory cell transistors have reached a first target threshold voltage state and whether second memory transistors have reached a second target threshold voltage state, and a bit scan operation for at least acquiring the number of first memory cell transistors determined not to have reached the first target threshold voltage state and the number of second memory cell transistors determined not to have reached the second target threshold voltage state, wherein
the bit scan operation includes
a first process of generating in parallel first verify result data for each of the first memory cell transistors and second verify result data for each of the second memory cell transistors, the first verify result data for each of the first memory cell transistors indicating whether the first memory cell transistor has reached the first threshold voltage state, and the second verify result data for each of the second memory cell transistors indicating whether the second memory cell transistor has reached the second threshold voltage state, and a second process of calculating the number of first memory cell transistors that have not reached the first target threshold voltage state and the number of second memory cell transistors that have not reached the second target threshold voltage state.

17. The method according to claim 16, further comprising:

comparing the number of first memory cell transistors that have not reached the first target threshold voltage state against a first number of memory transistors to be programmed to at least the first target threshold voltage state to determine if the verify operation in the next loop should be performed for the first target threshold voltage; and comparing the number of second memory cell transistors that have not reached the second target threshold voltage state against a second number of memory transistors to be programmed to at least second target threshold voltage state to determine if the verify operation in the next loop should be performed for the second target threshold voltage.

18. The method according to claim 16, wherein the semiconductor memory device includes a plurality of sense amplifier units, each connected to one of the memory cell transistors through a respective bit line, and the verify result data for each memory cell transistor is stored in a latch circuit in a respective one of the sense amplifier units.

19. The method according to claim 16, wherein the bit scan operation is performed in a period from a completion of the verify operation of a current loop to a start of the verify operation of a next loop.

20. The method according to claim 16, wherein the bit scan operation is performed during a period in which the program operation of a next loop is being executed.

* * * * *